United States Patent
Saito

(10) Patent No.: US 9,607,962 B2
(45) Date of Patent: Mar. 28, 2017

(54) SEMICONDUCTOR DEVICE AND MANUFACTURING METHOD THEREOF

(71) Applicant: Renesas Electronics Corporation, Tokyo (JP)

(72) Inventor: Kentaro Saito, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 15/009,473

(22) Filed: Jan. 28, 2016

(65) Prior Publication Data

US 2016/0148897 A1    May 26, 2016

Related U.S. Application Data

(63) Continuation of application No. 14/639,062, filed on Mar. 4, 2015, now abandoned.

(30) Foreign Application Priority Data

Mar. 7, 2014  (JP) .................. 2014-045679

(51) Int. Cl.
*H01L 23/00* (2006.01)
*H01L 21/74* (2006.01)
(Continued)

(52) U.S. Cl.
CPC ............ *H01L 24/49* (2013.01); *H01L 21/743* (2013.01); *H01L 21/78* (2013.01); *H01L 23/10* (2013.01);
(Continued)

(58) Field of Classification Search
CPC ..................................... H01L 24/05
See application file for complete search history.

(56) References Cited

U.S. PATENT DOCUMENTS 6,384,464 B1 * 5/2002 Shin ............... H01L 23/528
257/203
6,614,120 B2  9/2003 Sato et al.
(Continued)

FOREIGN PATENT DOCUMENTS

| JP | H 05-235085 A | 9/1993 |
| JP | 2003-45876 A | 2/2003 |
| JP | 2010-10197 A | 1/2010 |

OTHER PUBLICATIONS

Non-Final Office Action dated Oct. 28, 2015 in U.S. Appl. No. 14/639,062.

(Continued)

*Primary Examiner* — William Harriston
(74) *Attorney, Agent, or Firm* — McGinn IP Law Group, PLLC

(57) ABSTRACT

A semiconductor device includes a corner constituted by a first side and a second side being perpendicular to the first side; and a plurality of pads including a first pad, arranged along the second side and formed over a semiconductor substrate. The first pad is arranged nearer the corner than other pads of the plurality of pads. The first pad includes a third side, a fourth side being perpendicular to the third side, a fifth side being parallel to the third side and a sixth side being perpendicular to a fifth side. The third side and the fourth side are nearer to the corner than the fifth side and sixth side. A first dummy wiring is formed along the first side. A second dummy wiring is formed along the second side. The first dummy wiring and the second dummy wiring are formed integrally with each other.

11 Claims, 19 Drawing Sheets

(51) Int. Cl.
*H01L 21/78* (2006.01)
*H01L 23/58* (2006.01)
*H01L 23/10* (2006.01)
*H01L 23/31* (2006.01)
*H01L 23/522* (2006.01)

(52) U.S. Cl.
CPC ........ *H01L 23/3157* (2013.01); *H01L 23/585* (2013.01); *H01L 24/03* (2013.01); *H01L 24/05* (2013.01); *H01L 24/06* (2013.01); *H01L 24/09* (2013.01); *H01L 24/48* (2013.01); *H01L 23/3107* (2013.01); *H01L 23/3192* (2013.01); *H01L 23/522* (2013.01); *H01L 23/562* (2013.01); *H01L 24/45* (2013.01); *H01L 2224/02166* (2013.01); *H01L 2224/02235* (2013.01); *H01L 2224/03009* (2013.01); *H01L 2224/0361* (2013.01); *H01L 2224/03827* (2013.01); *H01L 2224/04042* (2013.01); *H01L 2224/05553* (2013.01); *H01L 2224/05557* (2013.01); *H01L 2224/05624* (2013.01); *H01L 2224/06179* (2013.01); *H01L 2224/45144* (2013.01); *H01L 2224/48091* (2013.01); *H01L 2224/48177* (2013.01); *H01L 2224/48247* (2013.01); *H01L 2224/48463* (2013.01); *H01L 2224/48624* (2013.01); *H01L 2924/13091* (2013.01); *H01L 2924/181* (2013.01); *H01L 2924/3512* (2013.01)

(56) References Cited

U.S. PATENT DOCUMENTS

2003/0034567 A1  2/2003  Sato
2009/0008803 A1  1/2009  Hou
2009/0289357 A1  11/2009  Fujimoto

OTHER PUBLICATIONS

United States Notice of Allowance dated Apr. 29, 2016 in co-pending U.S. Appl. No. 14/639,062.

* cited by examiner

SEMICONDUCTOR DEVICE AND MANUFACTURING METHOD THEREOF

CROSS-REFERENCE TO RELATED APPLICATIONS

The present application is a Continuation application of U.S. patent application Ser. No. 14/639,062, filed on Mar. 4, 2015, which is based on Japanese Patent Application No. 2014-045679 filed on Mar. 7, 2014, the entire contents of which are hereby incorporated by reference.

BACKGROUND

The present invention relates to a semiconductor device and a manufacturing technique thereof, and for example, to a technology effective in applying to a semiconductor device having pads and a manufacturing technique thereof.

Japanese Unexamined Patent Application Publication No. 2003-45876 describes a technique for forming dummy wiring around a pad.

Japanese Unexamined Patent Application Publication No. Hei 5 (1993)-235085 describes a technique for providing a dummy pad exposed from a cover film so as to surround a bonding pad.

Japanese Unexamined Patent Application Publication No. 2010-10197 describes a technique for providing, in a corner of a semiconductor chip, a small pad to be used exclusively for a probe.

SUMMARY

For example, in a pad formed in a semiconductor chip, an end portion of the pad is covered with a surface protective film, while most of the surface of the pad is exposed from an opening provided in the surface protective film. That is, in the end portion of the pad, the surface protective film is formed to cover a level difference resulting from the thickness of the pad.

Herein, a crack may occur in the surface protective film, covering a level difference formed in the end portion of the pad, by the stress applied when dicing for cutting semiconductor chips into pieces is performed, or the stress applied from a sealing body for sealing a semiconductor chip, etc. In particular, for a pad arranged near a corner of a semiconductor chip having a rectangular shape, there is the tendency that a crack is likely to occur in a surface protective film covering a level difference formed in an end portion of the pad. That is, because stress is likely to be applied in a corner of a semiconductor chip, occurrence of a crack is likely to become obvious in a surface protective film covering a level difference formed in an end portion of a pad. From the fact described above, there is room for improvement in the current semiconductor devices, from the viewpoint of improving the reliability of a semiconductor device by suppressing occurrence of a crack in a surface protective film covering a level difference formed in an end portion of a pad.

Other problems and new characteristics will become clear from the description and accompanying drawings of the present specification.

A semiconductor device according to one embodiment has dummy wiring provided around a first pad arranged at a position nearest to a corner of a semiconductor chip. In this case, the dummy wiring includes: a first dummy part provided to be spaced apart from and to be parallel to, of a plurality of sides that form the first pad, a first side nearest to the corner of the semiconductor chip; and a second dummy part provided to be spaced apart from and to be parallel to a second side nearest to an edge side of the semiconductor chip.

A method of manufacturing a semiconductor device according to one embodiment includes the steps of: forming a plurality of pads each having a rectangular shape along a boundary line between a chip region and a scribe region and within the chip region; and forming dummy wiring around, of the pads, a first pad nearest to a corner of the chip region. In this case, the dummy wiring includes: a first dummy part provided to be spaced apart from and to be parallel to, of a plurality of sides that form the first pad, a first side nearest to a corner of a semiconductor chip; and a second dummy part provided to be spaced apart from and to be parallel to a second side nearest to an edge side of the semiconductor chip.

According to one embodiment, the reliability of a semiconductor device can be improved.

DETAILED DESCRIPTION

Figure 1:
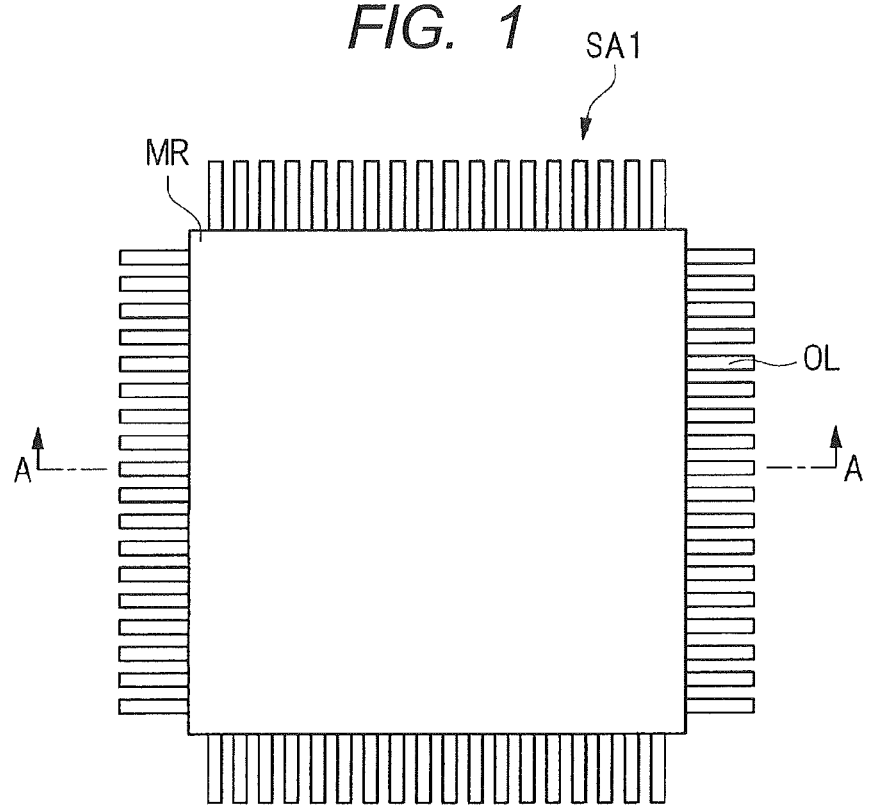
FIG. 1 is a plan view of a semiconductor device including a QFP package, when viewed from upside.

When necessary for convenience in the following embodiment, description is given by dividing the embodiment into a plurality of sections or embodiments, however, unless stated explicitly, they are not independent of one another, but one is related with the other part or the whole as a modification example, a detail, supplementary description, etc.

When referring to the number of elements, etc. (including number of pieces, numerical value, quantity, range, etc.) in the following embodiment, unless stated explicitly or except when the number is obviously limited to specific numbers in principle, the number is not limited to the specific ones but may be more or less than the specific numbers.

Further, in the following embodiment, it is needless to say that components (also including constituent steps, etc.) are not necessarily requisite unless stated explicitly or except when they are obviously requisite in principle.

Similarly, when referring to the shapes and positional relations, etc., of components, etc., in the following embodiment, unless stated explicitly or except when they can be thought otherwise in principle, those substantially the same or similar to the shapes, etc., are to be included. This also applies to the aforementioned numerical values and ranges.

In addition, like components are denoted with like reference numerals in principle in each of the views for explaining embodiments, and duplicated descriptions are omitted. For easy understanding of drawings, hatching lines are sometimes drawn even in a plan view.

Embodiment

Example of Configuration of Semiconductor Device (OFP Package)

There are various types of package structures of semiconductor devices, such as, for example, a BGA (Ball Grid Array) package and a OFP (Quad Flat Package) package. The technical ideas of the present embodiments can be applied to these packages, and hereinafter a configuration of a semiconductor device including a QFP package will be described as an example.

FIG. 1 is a plan view of a semiconductor device SA1 including a QFP package, when viewed from upside. As illustrated in FIG. 1, the semiconductor device SA1 has a rectangular shape, and the upper surface of the semiconductor device SA1 is covered with a resin (sealing body) MR. Outer leads OL protrude toward the outside from four sides by which the outer shape of the resin MR is defined.

Figure 2:
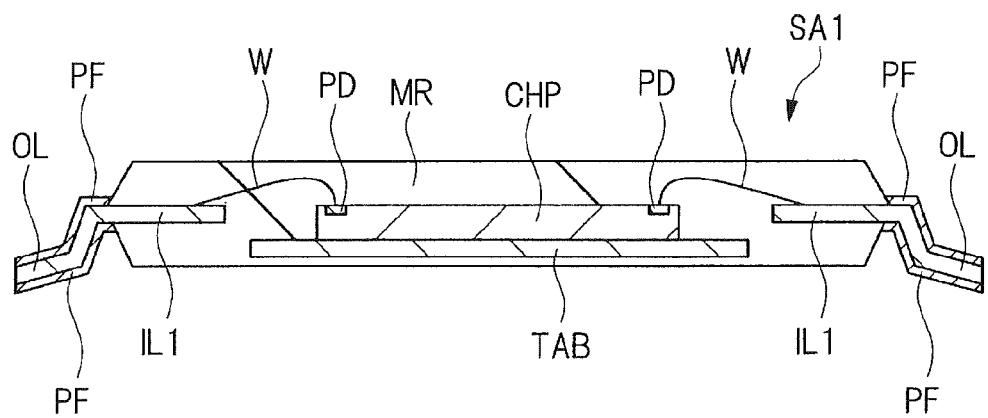
FIG. 2 is a sectional view, taken along A-A line in FIG. 1.

Subsequently, the internal structure of the semiconductor device SA1 will be described. FIG. 2 is a sectional view, taken along A-A line in FIG. 1. As illustrated in FIG. 2, the rear surface of a chip mounting part TAB is covered with the resin MR. On the other hand, a semiconductor chip CHP is mounted over the upper surface of the chip mounting part TAB, and the chip mounting part TAB is separated from an inner lead IL1 (lead terminal). A pad PD is formed in the main surface of the semiconductor chip CHP. The pad PD, formed in the semiconductor chip CHP, is electrically coupled to the inner lead IL1 by a wire W. The semiconductor chip CHP, the wire W, and the inner lead IL1 are covered with the resin MR, and the outer lead OL (lead terminal), integrated with the inner lead IL1, protrudes from the resin MR. The outer lead OL, protruding from the resin MR, is formed into a gull-wing shape, and a metal-plated film PF is formed over the surface of the outer lead OL.

The chip mounting part TAB, the inner lead IL1, and the outer lead OL are formed, for example, of a copper material, 42 Alloy (alloy of iron and nickel), or the like, while the wire W is formed, for example, of a gold wire. The semiconductor chip CHP is formed, for example, of silicon or a compound semiconductor (GaAs, etc.), and a plurality of semiconductor elements, such as MOSFETs, are formed in this semiconductor chip CHP. Multilayer wiring is formed above the semiconductor elements via an interlayer insulating film, and a pad PD to be coupled to the multilayer wiring is formed in the uppermost layer of the multilayer wiring. Accordingly, the semiconductor elements formed in the semiconductor chip CHP are electrically coupled to the pad PD via the multilayer wiring. That is, an integrated circuit is formed by the semiconductor elements, formed in the semiconductor chip CHP, and the multilayer wiring, and the pad PD functions as a terminal for coupling the integrated circuit and the outside of the semiconductor chip CHP together. The pad PD is coupled to the inner lead IL1 by the wire W, and is also coupled to the outer lead OL formed integrally with the inner lead IL1. From this, it is known that the integrated circuit, formed in the semiconductor chip CHP, can be electrically coupled to the outside of the semiconductor device SA1 by a pathway including the pad PD, the wire W, the inner lead IL1, the outer lead OL, and an external coupling device in this order. That is, it is known that the integrated circuit, formed in the semiconductor chip CHP, can be controlled by inputting an electrical signal from the outer lead OL formed in the semiconductor device SA1. It is also known that an output signal from the integrated circuit can be taken out from the outer lead OL to the outside.

Figure 3:
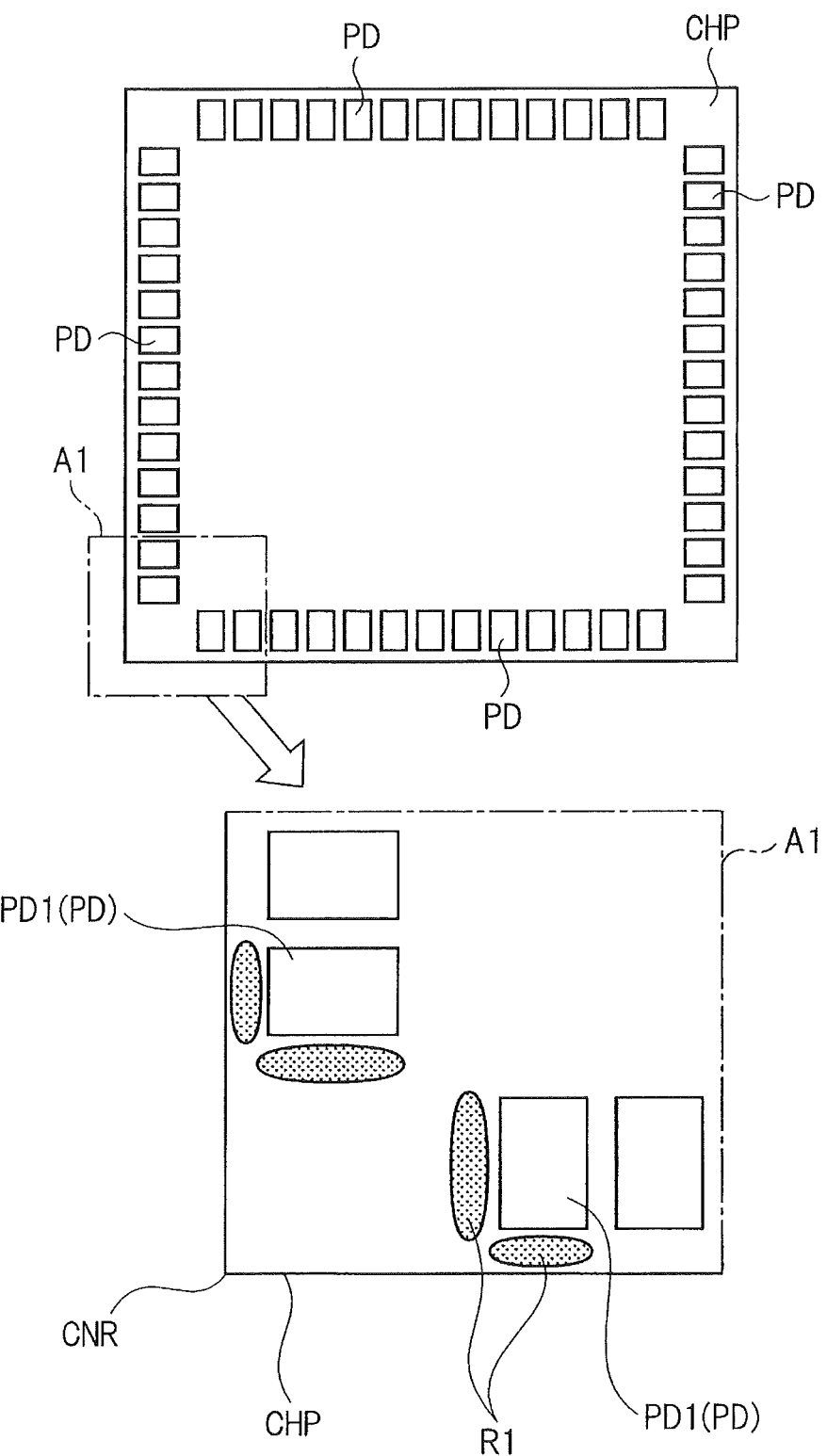
FIG. 3 is a view illustrating a layout configuration of a semiconductor chip.

Subsequently, FIG. 3 is a view illustrating a layout configuration of the semiconductor chip CRP. In FIG. 3, the semiconductor chip CHP has, for example, a rectangular shape, and a plurality of the pads PD are arranged along an edge side of the semiconductor chip CHP. In each of these pads PD, an end portion of the pad PD is covered with a surface protective film, while most of the surface of the pad PD is exposed from an opening provided in the surface protective film, although they are not illustrated in FIG. 3.

Herein, a crack may occur in the surface protective film, covering the end portion of the pad PD, by stress applied when dicing, for cutting the semiconductor chips CHP into pieces, is performed, or stress applied from the resin (sealing body) for sealing the semiconductor chip CHP, etc. In particular, there is the tendency that a crack is likely to occur in the surface protective film in a peripheral region R1 of a pad PD1 arranged to be nearest to a corner CNR of the semiconductor chip CHP, as illustrated, of FIG. 3, in an enlarged view of a region A1 that is a region near a corner of the semiconductor chip CHP. That is, stress is likely to be applied in the corner CNR of the semiconductor chip CHP, and hence occurrence of a crack becomes obvious in the surface protective film covering the end portion of the pad PD1 arranged to be nearest to the corner CNR. Accordingly, there is room for improvement in a semiconductor device in which the semiconductor chip CHP is sealed with a resin, from the viewpoint of suppressing occurrence of a crack in the surface protective film covering the end portion of the pad PD1 arranged to be nearest to the corner CNR. Hereinafter, details of the room for improvement will be described.

<Room for Improvement>

Figure 4:
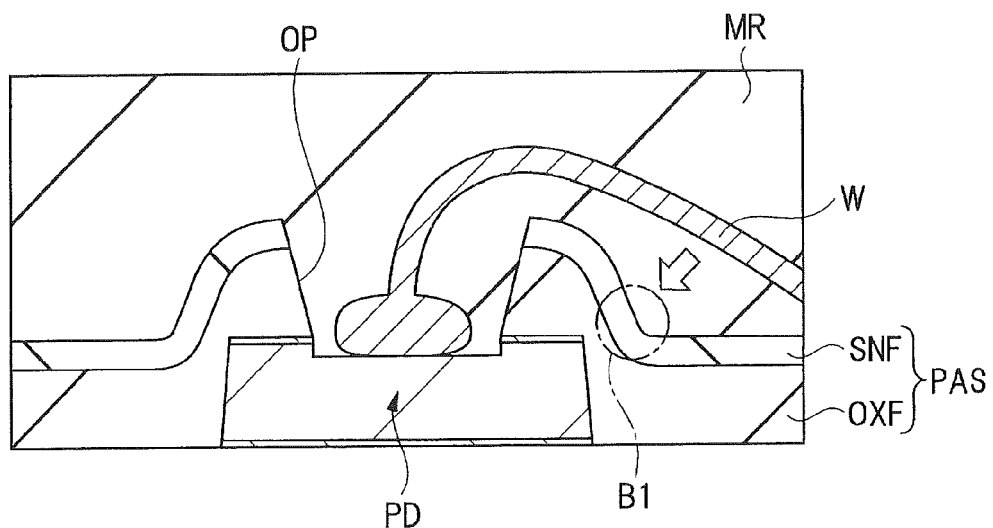
FIG. 4 is a sectional view illustrating a structure of a near-field region of a pad including the pad.

FIG. 4 is a sectional view illustrating a structure of a near-field region of the pad PD including the pad PD. AS illustrated in FIG. 4, a surface protective film PAS, including a laminated film, for example, of a silicon oxide film OXF and a silicon nitride film SNF, is formed to cover the pad PD including, for example, aluminum as a major component. An opening OP is formed in this surface protective film PAS, and part of the surface of the pad PD is exposed from the bottom of this opening OP. On the other hand, the end portion of the pad PD is covered with the surface protective film PAS. That is, in the end portion of the pad PD, the surface protective film PAS is formed to cover a level difference resulting from the thickness of the pad PD. Further, the wire W including, for example, a gold wire is coupled to the surface of the pad PD exposed from the opening OP, and the surface protective film PAS, including the surface of the pad PD to which the wire W is coupled, is covered, for example, with the resin MR.

Figure 5:
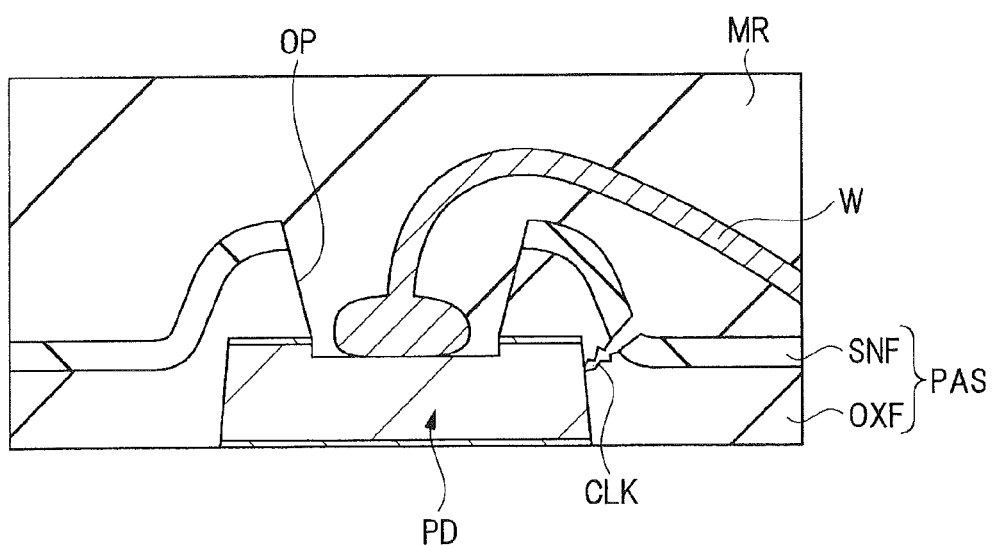
FIG. 5 is a view for explaining a mechanism of occurrence of "aluminum slide"

When attention is focused on a region B1 illustrated in FIG. 4, it is known that the covering shape of the surface protective film PAS becomes precipitous due to a level difference generated by the thickness of the pad PD and that the thickness of the surface protective film PAS in the region B1 becomes small. This means that the stress from the resin MR, sealing the surface protective film PAS, becomes large in the region B1 where the covering shape of the surface protective film PAS becomes precipitous and the thickness of the surface protective film PAS becomes small. That is, in the region B1 where the covering shape of the surface protective film PAS becomes precipitous and the thickness of the surface protective film PAS becomes small, large stress is applied from the resin MR, and as a result thereof, a crack is likely to occur in the surface protective film PAS, as illustrated in FIG. 5. In particular, the stress applied from the resin is likely to be large in the corner CNR of the semiconductor chip CHP illustrated in FIG. 3, and hence occurrence of a crack is likely to be obvious in the peripheral region R1 of the surface protective film covering the end portion of the pad PD (PD1) arranged to be nearest to the corner CNR.

Moreover, semiconductor elements represented by a field-effect transistor (MOSFET: Metal Oxide Semiconductor Field Effect Transistor) and the wiring to be coupled to the semiconductor elements are recently being miniaturized. With such miniaturization of the semiconductor elements and the wiring being developed, there is the tendency that the thickness of the pad PD becomes large. It is because the development of the generations of the miniaturization of the semiconductor elements and the wiring actually means that an integrated circuit formed in the semiconductor chip CHP is highly integrated, and thereby an amount of the current to be used in the semiconductor chip CHP is increased, although it is superficially thought that, with the aforementioned development, the thickness of the pad PD is also made small. That is, an increase in the amount of current to be used in the semiconductor chip CHP means that a large current flows through the pad PD coupled to a highly integrated circuit, which requires the thickness of the pad PD to be made large, because the resistance of the pad PD needs to be made as low as possible. From this, there is the tendency that the thickness of the pad PD becomes large, with the development of the generations of miniaturization. This means that a level difference, resulting from the thickness of the pad PD, becomes large in a product manufactured in a developed generation of miniaturization. Thereby, it can be considered that precipituousness of the covering shape of the surface protective film PAS and thinning of the thickness of the surface protective film PAS may become remarkable in the region B1 illustrated, for example, in FIG. 4.

From the facts described above, it can be considered that: the stress applied from the resin MR to the region B1 of the surface protective film PAS, covering the end portion of the pad PD arranged to be nearest to the corner CNR of the semiconductor chip CHP, becomes large in a product manufactured in a developed generation of miniaturization; and as a result thereof, occurrence of a crack CLK in the surface protective film PAS becomes more obvious. That is, it can be considered that, in a product manufactured in a more developed generation of miniaturization and in the pad PD arranged to be nearest to the corner CNR of the semiconductor chip CHP, the crack CLK is more likely to occur in the surface protective film PAS, due to a level difference resulting from the thickness of the pad PD, and hence it becomes more necessary to suppress occurrence of a crack CLK in the surface protective film PAS.

Figure 6:
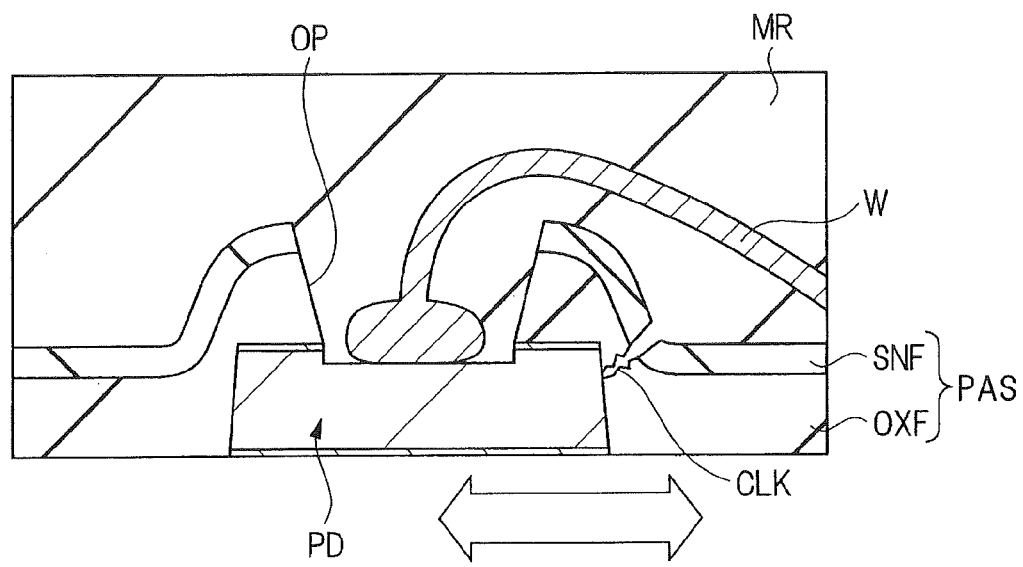
FIG. 6 is a view for explaining a mechanism of occurrence of "aluminum slide"
Figure 7:
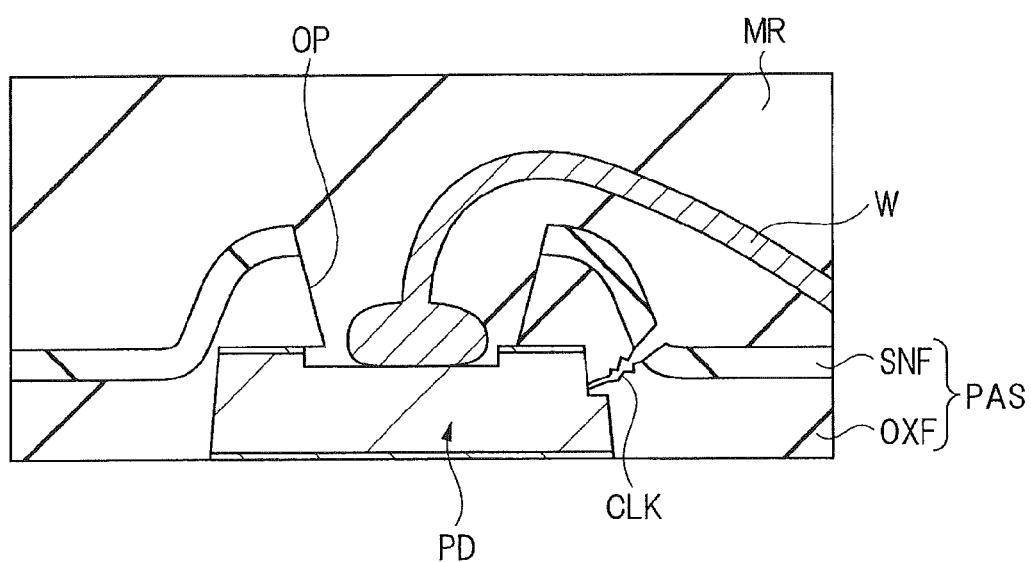
FIG. 7 is a view for explaining a mechanism of occurrence of "aluminum slide"

When the crack CLK occurs in the surface protective film PAS as illustrated in FIG. 5, a phenomenon, which is referred to as so-called "aluminum slide", occurs by a heat cycle test performed after a product is completed, in which the positions of part of the pads PD are shifted. Specifically, in the heat cycle test, the reliability of a semiconductor device is checked by repeatedly changing a temperature, for example, between −65° C. and 150° C. In this case, when a temperature is repeatedly changed in a state where the crack CLK occurs in the surface protective film PAS, as illustrated in FIG. 6, the positions of part of the pads PD are shifted, as illustrated in FIG. 7, by the stress resulting from expansion and contraction of the resin MR based on the temperature change, which causes the "aluminum slide". If such "aluminum slide" occurs, the positions of part of the pads PD are shifted from normal positions, which may causes an appearance defect of the pad PD. Accordingly, in order to suppress an appearance defect of the pad PD, it is necessary to suppress "aluminum slide" that is a phenomenon in which the position of the pad PD is shifted. Because the "aluminum slide" occurs by occurrence of the crack CLK in the surface protective film PAS, it is necessary to suppress occurrence of the crack CLK in the surface protective film PAS, in order to suppress an appearance defect of the pad PD.

Accordingly, a device is incorporated in the present embodiment, in which occurrence of the crack CLK in the surface protective film PAS, resulting from a level difference occurring due to the thickness of the pad PD, is suppressed. Hereinafter, the technical ideas of the present embodiment incorporating this device will be described.

<Configuration of Semiconductor Chip>

Figure 8:
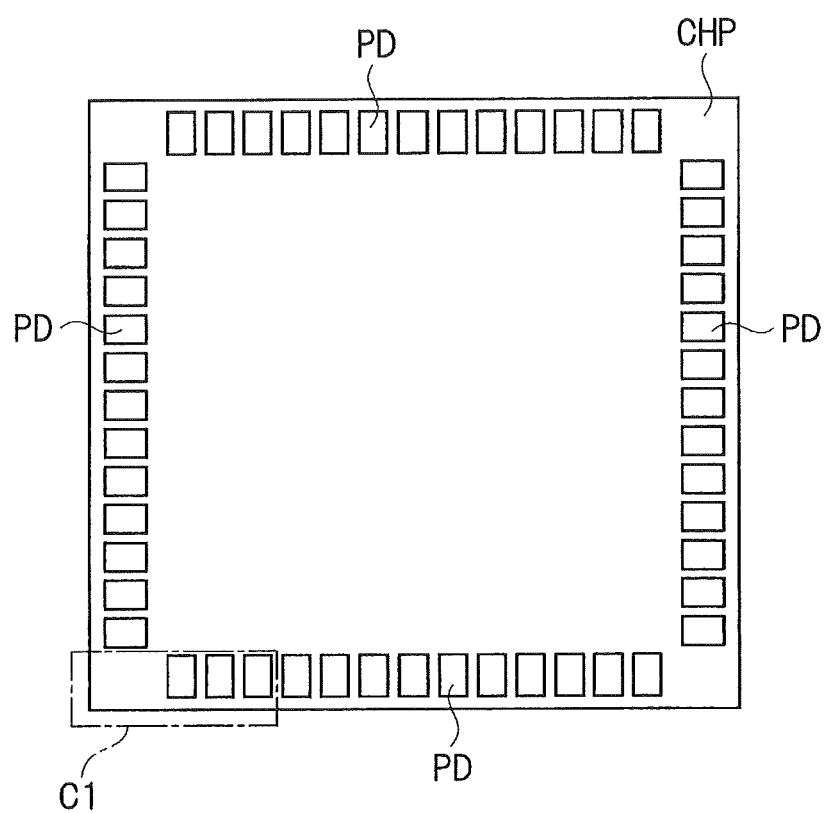
FIG. 8 is a view illustrating a layout configuration of a semiconductor chip according to an embodiment.

FIG. 8 is a view illustrating a layout configuration of the semiconductor chip CHP according to the present embodiment. In FIG. 8, the semiconductor chip CHP has, for example, a rectangular shape, and a plurality of the pads PD, each including aluminum as a major component, are arranged along an edge side of the semiconductor chip CHP. In each of these pads PD, an end portion of the pad PD is covered with a surface protective film, while most of the surface of the pad PD is exposed from an opening provided in the surface protective film, although they are not illustrated in FIG. 8.

As used herein, the "major component" means, of constituent materials that form members (layers and films), a material component that is included in the largest amount, and for example, the "pad PD including aluminum as a major component" means that the material for the pad PD includes aluminum (Al) in the largest amount. In the present specification, the term "major component" is intended to express that, for example, the pad PD is basically formed by aluminum but the case where impurities are also included is not excluded.

For example, when attention is focused on the pad PD generally used in a semiconductor device, this pad PD has a configuration in which an aluminum film is usually sandwiched by barrier conductor films including a titanium/titanium nitride film. That is, the pad PD including a first barrier conductor film, an aluminum film formed over the first barrier conductor film, and a second barrier conductor film formed over the aluminum film. In this case, when the pad PD is formed by a laminated film including the first barrier conductor film, the aluminum film, and the second barrier conductor film, this pad PD is referred to as the "pad PD including aluminum as a major component", because the pad PD is mostly occupied by the aluminum film.

Additionally, the aluminum film as used herein is used to have a wide concept including: an aluminum film having pure aluminum; an aluminum alloy film (AlSi film) having silicon added to aluminum; and an aluminum alloy film (AlSiCu film) having silicon and copper added to aluminum. The pads PD including these aluminum alloy films are also included in the "pad PD including aluminum as a major component." That is, the "pad PD including aluminum as a major component" as used herein is applied to the pad PD including an aluminum film and a barrier conductor film, and also applied to the pad PD in which an aluminum film itself is an aluminum alloy film.

Characteristics in Embodiment

Figure 9:
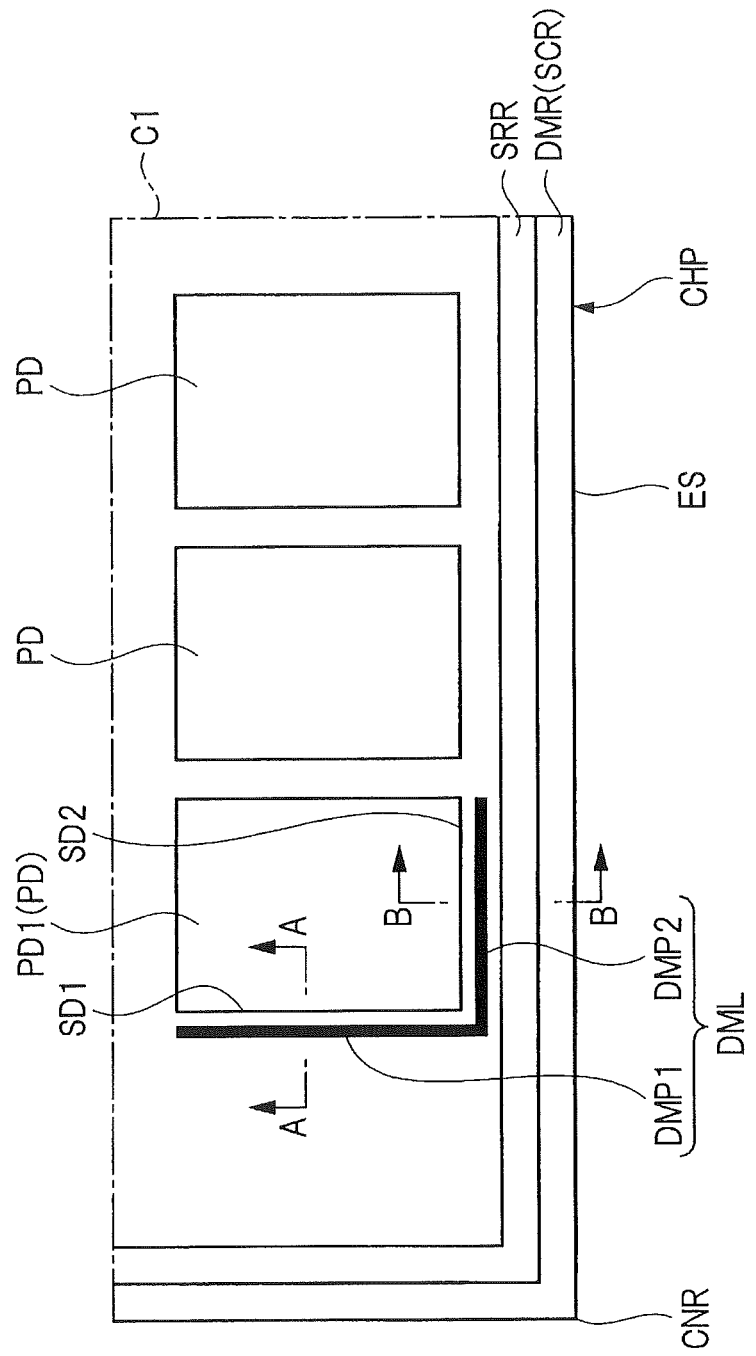
FIG. 9 is an enlarged view in which a partial region of FIG. 8 is enlarged.

Subsequently, characteristic points in the present embodiment will be described. FIG. 9 is an enlarged view in which the region C1 of FIG. 8 is enlarged. In FIG. 9, the semiconductor chip CHP has the edge side ES, and a plurality of the pads PD, each having a rectangular shape, are arranged along the edge side ES and in a region inside the edge side ES. In detail, a dummy region DMR is first formed in the region inside the edge side ES of the semiconductor chip CHP, and a seal ring region SRR is formed in a region inside the dummy region DMR. A dummy pattern for suppressing procession of a crack, which may occur while dicing is being performed, into the semiconductor chip CHP (into a chip region) is provided in the dummy region DMR, and a seal ring for suppressing a foreign substance from entering the inside of the semiconductor chip CHP is provided in the seal ring region SRR. Herein, the dummy pattern in the dummy region DMR is not always necessary. However, it is preferable to provide the dummy pattern for prevention of the aforementioned crack or for improvement in the flatness for a CMP step performed when each wiring layer is formed.

For simple description, the dummy region DMR is described as part of the semiconductor chip CHP in the present embodiment. However, the dummy region DMR is a region integrated with the scribe region SCR in a wafer state before dicing is performed. Accordingly, the dummy region DMR may be expressed as part of the scribe region SCR in the later description.

The pads PD are arranged in a region inside the seal ring region SRR. Of the pads PD, the pad arranged at a position nearest to the corner CNR of the semiconductor chip CHP is referred to as a pad PD 1 in the present specification.

As illustrated in FIG. 9, the pad PD1 arranged at a position nearest to the corner CNR of the semiconductor chip CHP has a rectangular shape, and dummy wiring DML is provided around the pad PD1. The present embodiment is characterized by the fact that the dummy wiring DML is thus provided around the pad PD1. Specifically, the dummy wiring DML includes: a dummy part DMP1 provided to be spaced apart from and to be parallel to, of a plurality of sides that form the pad PD1, a side SD1 nearest to the corner CNR; and a dummy part DMP2 provided to be spaced apart from and to be parallel to, of the sides that form the pad PD1, a side SD2 nearest to the edge side ES of the semiconductor chip CHP, as illustrated in FIG. 9. That is, the dummy wiring DML is formed by the dummy part DMP1 extending along the side SD1 of the pad PD1 1 and the dummy part DMP2 extending along the side SD2 of the pad PD1. The dummy part DMP1 and the dummy part DMP2 are formed integrally with each other, and have, for example, an L-shape in plan view.

Figure 10:
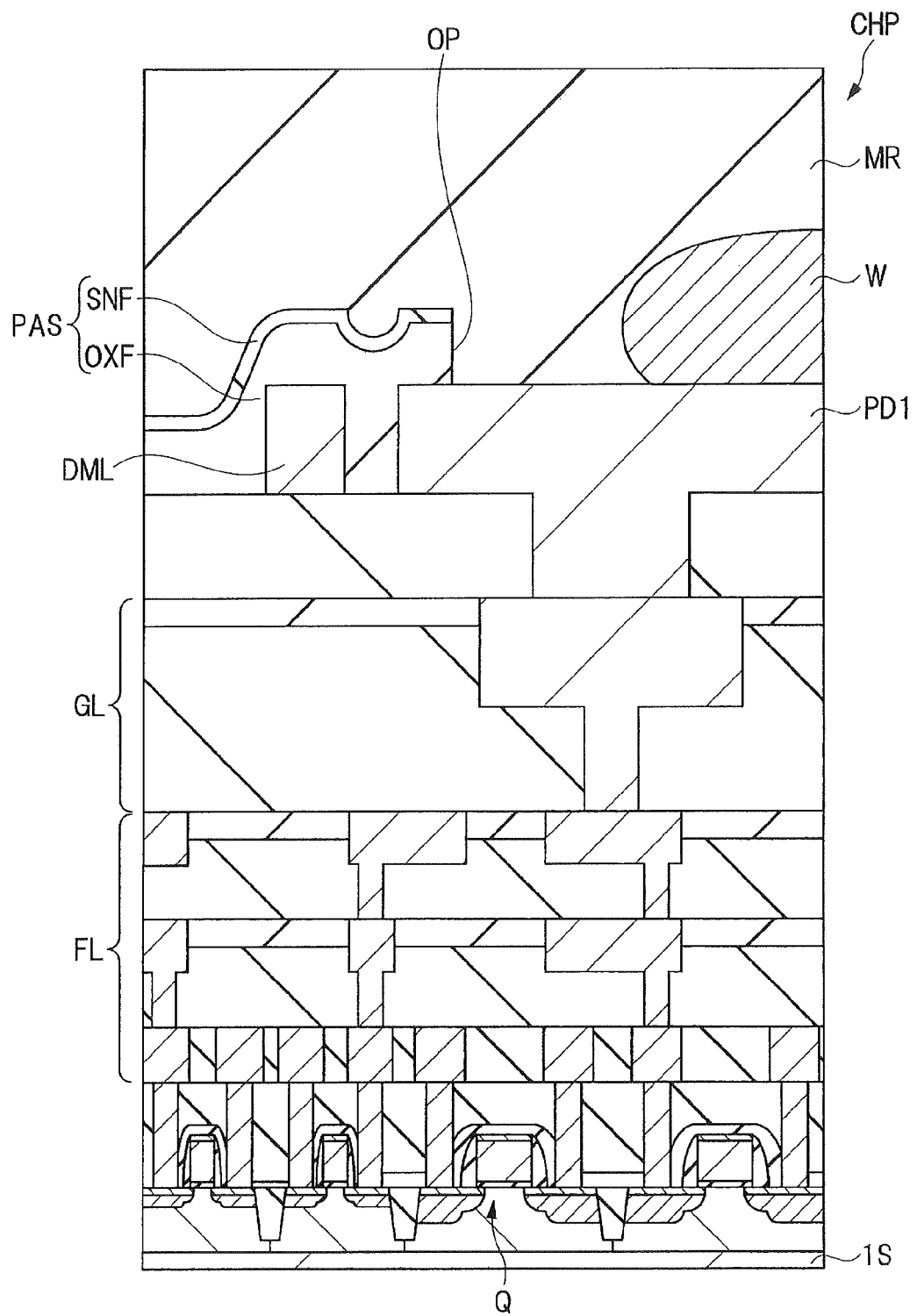
FIG. 10 is a sectional view, taken along A-A line in FIG. 9.

Subsequently, FIG. 10 is a sectional view, taken along A-A line in FIG. 9. As illustrated in FIG. 10, a field-effect transistor Q, an example of a semiconductor element, is formed over a semiconductor substrate 1S including, for example, silicon, and a fine layer FL including, for example, fine copper wiring is formed over the field-effect transistor Q. A global layer GL, including copper wiring having a width lager than that of the copper wiring that forms the fine layer FL, is formed over the fine layer FL. The pad PD1 is formed over the global layer GL, and the pad PD1 and the global layer GL form the dummy wiring DML. In this case, the level of the surface of the dummy wiring DML is the same as that of the surface of the pad PD1, as illustrated in FIG. 10.

Herein, the pad PD1 is electrically coupled to the field-effect transistor Q formed over the semiconductor substrate 1S via the global layer GL and the fine layer FL, as illustrated in FIG. 10. On the other hand, the dummy wiring DML is not electrically coupled to the field-effect transistor Q, which is a semiconductor element, and hence dose not function as usual wiring (actual wiring) to be used for transmission of an electrical signal or for supply of power supply voltage, etc. That is, the pad PD1 forms part of an integrated circuit, while the dummy wiring DML does not form part of the integrated circuit. From this, the potential of the dummy wiring DML is, for example, in a floating state.

Subsequently, the surface protective film PAS is formed to cover the pad PD1 and the dummy wiring DML, which are formed in the same layer. The surface protective film PAS is formed of a laminated film including, for example, the silicon oxide film OXF and the silicon nitride film SNF. The opening OP is formed in the surface protective film PAS, and part of the surface of the pad PD is exposed from the bottom of the opening OP. On the other hand, an opening is not formed over the dummy wiring DML, and the dummy wiring DML is covered with the surface protective film PAS.

The wire W including, for example, a gold wire is coupled to the surface of the pad PD exposed from the opening OP, and the surface protective film PAS, including the surface of the pad PD1 to which the wire W is coupled, is covered, for example, with the resin MR.

Figure 11:
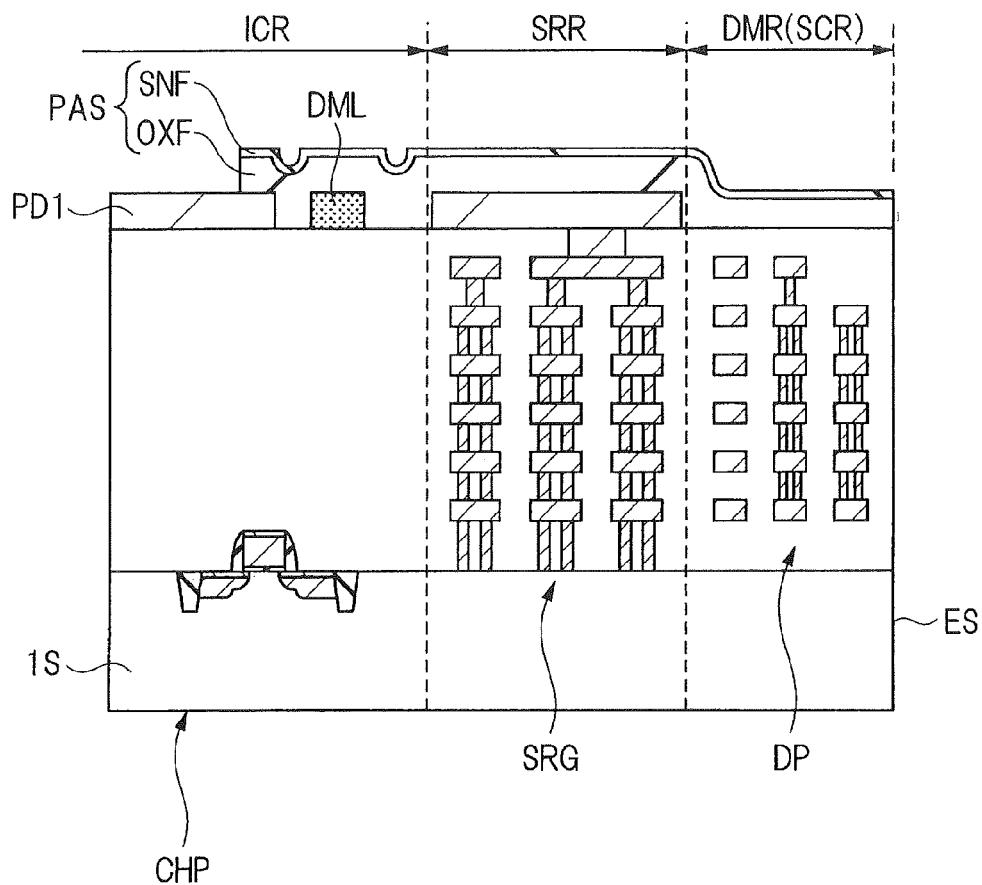
FIG. 11 is a schematic sectional view, taken along B-B line in FIG. 9.

Subsequently, FIG. 11 is a schematic sectional view, taken along B-B line in FIG. 9. As illustrated in FIG. 11, the dummy region DMR is provided inside the edge side ES of the semiconductor chip CHP, and the dummy pattern DP is formed in the dummy region DMR. The seal ring region SRR is provided inside the dummy region DMR, and the seal ring SRG is formed in the seal ring region SRR. Further, a region inside the seal ring region SRR serves as an integrated circuit region ICR, and the pad PD1 and the dummy wiring DML, which are formed in the same layer, are formed in the integrated circuit region ICR. In this case, the dummy wiring DML is only provided between the pad PD1 and the seal ring SRG and there is no wiring to be electrically coupled to the semiconductor element in the present embodiment. That is, actual wiring that forms the integrated circuit is not formed between the pad PD1 and the seal ring SRG.

The seal ring SRG disclosed in the present embodiment is formed by coupling a multilayer wiring layer, and is coupled to the semiconductor substrate 1S. Although not illustrated in detail, the seal ring SRG is coupled to a well formed in the semiconductor substrate 1S to have a fixed potential, such as a ground potential, etc. On the other hand, the dummy pattern DP is formed by a multilayer wiring layer, similarly to the seal ring SRG, and respective wiring layers may be coupled together or separated from each other. Unlike the seal ring SRG, the dummy pattern DP is not coupled to a fixed potential and is in a floating state.

As illustrated in FIG. 11, the surface protective film PAS, including the silicon oxide film OXF and the silicon nitride film SNF, is further formed to cover the pad PD1 and the dummy wiring DML, which are formed in the same layer. The opening OP is formed in the surface protective film PAS, and part of the surface of the pad PD1 is exposed from the bottom of the opening OP, while the dummy wiring DML is covered with the surface protective film PAS. The surface protective film PAS is further formed to extend to the edge side ES of the semiconductor chip CHP by covering the seal ring region SRR and the dummy region DMR, which are formed outside the integrated circuit region ICR.

Herein, a wiring structure and a device structure, which are formed in layers lower than the pad PD1 and the dummy wiring DML formed in the integrated circuit region ICR, are basically the same as those in FIG. 10, and hence they are omitted in FIG. 11. Also, a wire to be coupled to the pad PD1 and a resin covering the surface protective film PAS are not illustrated in FIG. 11.

As described above, the present embodiment is characterized by the fact that the dummy wiring DML is provided around the pad PD1 arranged at a position nearest to the corner CNR of the semiconductor chip CHP, as illustrated, for example, in FIGS. 9 to 11. Further, the present embodiment is characterized by the fact that the dummy wiring DML is formed to include: the dummy part DMP1 provided to be spaced apart from and to be parallel to the side SD1 nearest to the corner CNR; and the dummy part DMP2 provided to be spaced apart from and to be parallel to the side SD2 nearest to the edge side ES of the semiconductor chip CHP. Thereby, the remarkable effect that the reliability of a semiconductor device can be improved can be acquired according to the present embodiment. Specifically, the remarkable effect that, in a semiconductor device in which a semiconductor chip is sealed by a resin, occurrence of a crack in a surface protective film covering the end portion of the pad PD1 arranged to be nearest to the corner CNR can be suppressed can be acquired according to the technical ideas of the present embodiment. Hereinafter, the reason why the aforementioned remarkable effect can be acquired according to the present embodiment will be described.

Figure 12:
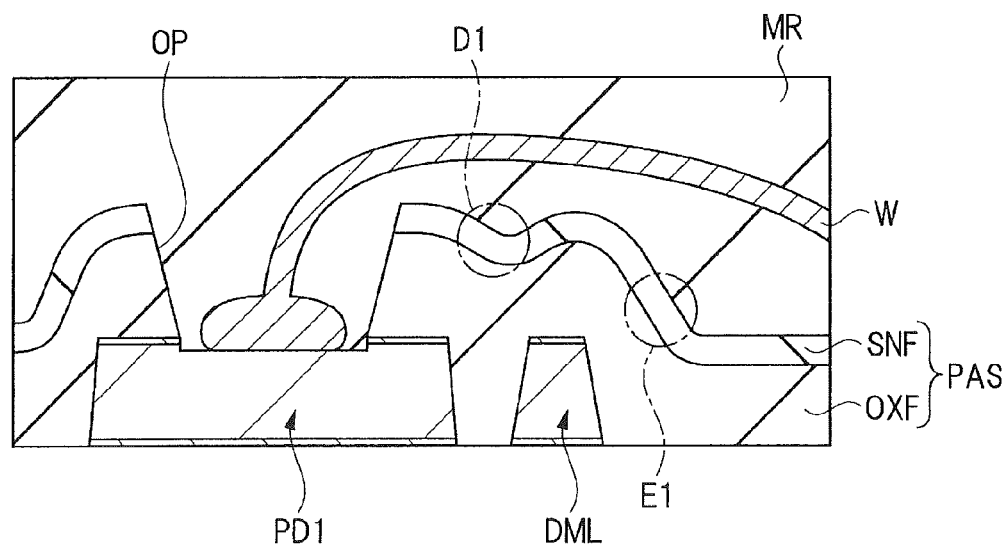
FIG. 12 is a sectional view illustrating, in a semiconductor device according to an embodiment, a structure of a pad and a periphery thereof, the pad being arranged at a position nearest to a corner of a semiconductor chip.

FIG. 12 is a sectional view illustrating, in a semiconductor device according to the present embodiment, a structure of the pad PD1 and a periphery thereof, the pad PD1 being arranged at a position nearest to a corner of a semiconductor chip. AS illustrated in FIG. 12, a surface protective film PAS, including a laminated film, for example, of a silicon oxide film OXF and a silicon nitride film SNF, is formed to cover the pad PD1 including aluminum as a major component. An opening OP is formed in the surface protective film PAS, and part of the surface of the pad PD1 is exposed from the bottom of the opening OP. On the other hand, the end portion of the pad PD1 is covered with the surface protective film PAS. Further, a wire W including, for example, a gold wire is coupled to the surface of the pad PD1 exposed from the opening OP, and the surface protective film PAS, including the surface of the pad PD1 to which the wire W is coupled, is covered, for example, with a resin MR. In the present embodiment, the dummy wiring DML is formed at a position spaced apart from the pad PD1, and the surface protective film PAS is formed to cover also the dummy wiring DML.

Herein, when attention is first focused on the region B1 in FIG. 4 illustrating a pad structure in which the dummy wiring DML is not formed, it is known that the covering shape of the surface protective film PAS becomes precipitous due to a level difference generated by the thickness of the pad PD1 and that the thickness of the surface protective film PAS becomes small in the region B1. This means that the stress from the resin MR, sealing the surface protective film PAS, becomes large in the region B1 where the covering shape of the surface protective film PAS becomes precipitous and the thickness of the surface protective film PAS becomes small. That is, in the region B1 where the covering shape of the surface protective film PAS becomes precipitous and the thickness of the surface protective film PAS becomes small, large stress is applied from the resin MR, and as a result thereof, a crack is likely to occur in the surface protective film PAS.

On the other hand, when attention is focused on the region D1 in FIG. 12 illustrating a pad structure in which the dummy wiring DML is formed, it is known that, as a result that the dummy wiring DML is formed in a near-field region of the pad PD1, even if a level difference resulting from the thickness of the pad PD1 is generated, the precipitousness of the curving shape of the surface protective film PAS is made gentler and the thickness of the surface protective film PAS in the region D1 becomes larger than those in the region B1 in FIG. 4. This means that the stress from the resin MR that seals the surface protective film PAS is suppressed in the region D1. That is, the stress from the resin MR is suppressed in the region D1 where the precipitousness of the curving shape of the surface protective film PAS is made gentle and the thickness of the surface protective film PAS becomes large. As a result thereof, a crack hardly occurs in the surface protective film PAS covering the end portion of the pad PD1, according to the present embodiment.

According to the present embodiment, by thus providing the dummy wiring DML in a near-field region of the end portion of the pad PD1, the precipitousness of the curving shape of the surface protective film PAS, covering the end portion of the pad PD1, can be made gentle and the thickness of the surface protective film PAS can be made large in the region D1 of the surface protective film PAS, even if a level difference resulting from the thickness of the pad PD1 is present in the region D1. That is, by providing the dummy wiring DML in a near-field region of the end portion of the pad PD1, stress resistance can be improved in the region D1 to which the stress from the resin MR that seals the surface protective film PAS is likely to be applied, according to the present embodiment. As a result thereof, occurrence of a crack in the surface protective film PAS can be suppressed in the region D1, according to the present embodiment, and thereby "aluminum slide", which is likely to occur when a heat cycle test is performed in a state where a crack occurs in the surface protective film PAS, can be effectively suppressed. The fact that the "aluminum slide" can be suppressed means that an appearance defect of the pad PD1 can be reduced, and thereby the reliability of a semiconductor device can be improved according to the present embodiment.

There is the tendency that, with the generations of miniaturization of both semiconductor elements represented by a field-effect transistor and wiring being developed, the thickness of the pad PD1 becomes larger. This means that, in a product manufactured in a developed generation of miniaturization, a level difference resulting from the thickness of the pad PD1 becomes large. Accordingly, it can be considered that, when miniaturization of semiconductor elements and wiring is developed, the precipitousness of the covering shape of the surface protective film PAS, covering the end portion of the pad PD1, and the thinning of the thickness of the surface protective film PAS are likely to become obvious as problems. That is, with a product manufactured in a more developed generation of miniaturization, a crack is more likely to occur in the surface protective film PAS, due to a level difference resulting from the thickness of the pad PD1. Accordingly, it can be considered that, in a product manufactured in a developed generation of miniaturization, it becomes further important to suppress occurrence of a crack in the surface protective film PAS.

Regarding this point, the dummy wiring DML is formed in a near-field region of the pad PD1 in the present embodiment, and as a result thereof, even if a level difference resulting from the thickness of the pad PD1 is generated, the precipitousness of the covering shape of the surface protective film PAS, covering the end portion of the pad PD1, is made gentle and the thickness of the surface protective film PAS becomes large. This phenomenon will be similarly generated, even if the thickness of the pad PD1 becomes large and a level difference resulting from the thickness of the pad PD1 becomes large, with the generations of miniaturization of semiconductor elements and wiring being developed. From this, by forming the dummy wiring DML in a near-field region of the pad PD1, occurrence of a crack in the surface protective film PAS, covering the end portion of the pad PD1, can be effectively prevented according to the present embodiment, even if the generations of miniaturization of semiconductor elements and wiring are developed and a level difference resulting from the thickness of the pad PD1 becomes large. When the generations of miniaturization are developed and a level difference resulting from the thickness of the pad PD1 becomes large, namely, when occurrence of a crack is likely to become obvious, the availability of applying the technical ideas of the present embodiment is increased. However, it is needless to say that the remarkable effect that occurrence of a crack in the surface protective film PAS, covering the end portion of the pad PD1, is suppressed can be acquired by the technical ideas of the present embodiment, regardless of how large a level difference resulting from the thickness of the pad PD1 is.

In the present embodiment, the dummy wiring DML is provided around the pad PD1 nearest to the corner CNR of the semiconductor chip CHP, as illustrated in FIG. 9. Specifically, the dummy part DMP1, extending to be spaced apart from and along the side SD1 of the pad PD1, and the dummy part DMP2, extending to be spaced apart from and along the side2 of the pad PD1, are provided. Thereby, in the pad PD1 nearest to the corner CNR of the semiconductor chip CHP, to the pad PD1 stress being likely to be applied, occurrence of a crack in the surface protective film, covering the end portion of the pad PD1, can be suppressed. That is, with attention focused on that stress is likely to be applied to the pad PD1 nearest to the corner CNR of the semiconductor chip CHP, the dummy wiring DML is provided around the pad PD1 in the present embodiment, in order not to generate a crack in the surface protective film covering the end portion of the pad PD1. Further, it is known that, in the pad PD1 nearest to the corner CNR of the semiconductor chip CHP, a crack is likely to occur particularly in the peripheral region R1 that is: near to, of the sides that form the pad PD1, the side nearest to the corner CNR; and near to the side nearest to the edge side of the semiconductor chip CHP, as illustrated in FIG. 3. Accordingly, in view of this, the dummy part DMP1, which is spaced apart from and to be parallel to, of the sides that form the pad1 nearest to the corner CNR of the semiconductor chip CHP, the side SD1 nearest to the corner CNR, and the dummy part DMP2, which is spaced apart from and to be parallel to the side SD2 nearest to the edge side ES of the semiconductor chip CHP, are provided in the present embodiment, as illustrated in FIG. 9. Thereby, occurrence of a crack in the surface protective film covering the end portion of the pad PD1 can be effectively suppressed according to the present embodiment.

On the other hand, the dummy wiring DML is not provided around the pads PD other than the pad PD1 nearest to the corner CNR of the semiconductor chip CHP in the present embodiment, as illustrated, for example, in FIG. 9. This is because it is taken into consideration that, as described above, stress is likely to be applied particularly in the pad PD1 nearest to the corner CNR of the semiconductor chip CHP and a crack is likely to occur in the surface protective film covering the end portion of the pad PD1. In other words, it is taken into consideration that: in the pads PD other than the pad PD1 nearest to the corner CNR of the semiconductor chip CHP, stress to be applied is smaller than that in the pad PD1; and occurrence of a crack in the surface protective film, covering the end portion of the pad PD, does not become obvious.

In the present embodiment, the dummy wiring DML is thus provided only around the pad PD1 where occurrence of a crack becomes obvious, while it is not provided around the pads PD other than the pad PD1. That is, in the present embodiment, the dummy wiring DML is provided around the pad PD1 of minimum necessity where occurrence of a crack in the surface protective film becomes obvious, while it is not provided around the pads PD other than the pad PD1, because occurrence of a crack in the surface protective film hardly becomes obvious. Thereby, occurrence of a crack in the surface protective film can be suppressed without significant design modification of the pads PD, according to present embodiment. When expressed in another way, the distance between the respective pads PD becomes large if the dummy wiring DML is provided for each of the pads PD, which may cause an increase in the size of the semiconductor chip CHP. On the other hand, the dummy wiring DML is provided only around the pad PD1 of minimum necessity where occurrence of a crack in the surface protective film becomes obvious, in the present embodiment, and hence occurrence of a crack in the surface protective film can be suppressed without an increase in the size of the semiconductor chip CHP. That is, the remarkable effect that the reliability of a semiconductor device can be improved can be acquired, while the miniaturization of the semiconductor device is being kept, according to the present embodiment.

Additionally, in the present embodiment, the level of the surface of the pad PD1 and that of the surface of the dummy wiring DML are the same as each other, as illustrated in FIG. 12. Thereby, the covering shape of the surface protective film PAS covering the end portion of the pad PD1 can be made gentle and the thickness of the surface protective film PAS can be made large, in the region D1 illustrated in FIG. 12. That is, in the case where the level of the surface of the pad PD1 and that of the surface of the dummy wiring DML are the same as each other, the covering shape of the surface protective film PAS covering the end portion of the pad PD1 can be made gentler and the thickness of the surface protective film PAS can be made larger in the region D1 than those in the case where the levels of the two surfaces are different from each other. Thereby, occurrence of a crack in the surface protective film PAS, covering the end portion of the pad PD1, can be effectively suppressed according to the present embodiment.

From the facts described above, it is desirable to form the pad PD1 and the dummy wiring DML such that the levels of the surfaces thereof are the same as each other, from the viewpoint that the crack resistance of the surface protective film PAS, covering the end portion of the pad PD1, is increased by making the covering shape of the surface protective film PAS gentle and making the thickness of the surface protective film PAS in the region D1 large. However, when the dummy wiring DML is provided according to the technical ideas of the present embodiment, occurrence of a crack in the surface protective film PAS, covering the end portion of the pad PD1, can be suppressed, even in both of the cases where the levels of the surfaces of the pad PD1 and the dummy wiring DML are different from each other, and where the levels of the surfaces thereof are the same as each other.

Further, it is desirable to make the distance between the pad PD1 and the dummy wiring DML as small as possible, from the viewpoint that the crack resistance of the surface protective film PAS is improved. It is because, as the distance between the two becomes smaller, a level difference, resulting from the thickness of the pad PD1, is more hardly reflected in the covering shape of the surface protective film PAS. That is, as the distance between the two becomes smaller, the covering shape of the surface protective film PAS becomes duller to a level difference resulting from the thickness of the pad PD1. That is, by making the distance between the two small, the covering shape of the surface protective film PAS, covering the end portion of the pad PD1, can be made gentle and the thickness of the surface protective film PAS can be made large, in the region D1 illustrated in FIG. 12.

Accordingly, it is desirable to make the levels of the surfaces of the pad PD1 and the dummy wiring DML the same as each other and to make the distance between the two small, from the viewpoint of increasing the crack resistance of the surface protective film PAS by making the covering shape of the surface protective film PAS, covering the end portion of the pad PD1, gentle and making the thickness of the surface protective film PAS in the region D1 large.

In the present embodiment, the covering shape of the surface protective film PAS in the region D1 can be made gentle and the thickness of the surface protective film PAS in the region D1 can be made large, but the covering shape of the surface protective film PAS covering the outside of the dummy wiring DML becomes one in which a level difference resulting from the thickness of the dummy wiring DML is reflected, as illustrated in FIG. 12. That is, the covering shape of the surface protective film PAS in the region E1 in FIG. 12 becomes precipitous and the thickness thereof becomes small. Accordingly, occurrence of a crack in the region D1 illustrated in FIG. 12 can be suppressed in the present embodiment, but there is the possibility that a crack may occur in the region E1 illustrated in FIG. 12. However, even if a crack occurs in the region E1 illustrated in FIG. 12 and "aluminum slide" occurs based on the crack, this "aluminum slide" occurs in the dummy wiring DML. That is, even if a crack occurs in the region E1 illustrated in FIG. 12, "aluminum slide" does not occur in the pad PD1 itself, which does not cause any problem. In other words, "aluminum slide" in the pad PD1 itself can be suppressed when occurrence of a crack in the region D1 illustrated in FIG. 12 can be suppressed, and hence a problem does not occur even if there is the fear that a crack may occur in the region E1 illustrated in FIG. 12. In the present embodiment, it is important to surely suppress occurrence of a crack in the region D1 illustrated in FIG. 12, because, if a crack occurs in the surface protective film covering the end portion of the pad PD1 PAS, namely, occurs in the region D1 illustrated in FIG. 12, "aluminum slide" may occur in the pad D1. In the present embodiment, occurrence of a crack in the region D1 illustrated in FIG. 12 can be sufficiently suppressed by providing the dummy wiring DML around the pad PD1, and a problem does not occur even if there is the fear that a crack may occur in the region E1 illustrated in FIG. 12. However, if the distance between the pad PD1 and the dummy wiring DML is small, there is the possibility that: for example, the dummy wiring DML may undergo "aluminum slide" and contact the pad PD1; and the pad PD1, contacted with the dummy wiring DML by the "aluminum slide" of the dummy wiring DML, may also undergo "aluminum slide". Accordingly, it is also necessary not to make the distance between the pad PD1 and the dummy wiring DML too small, from the viewpoint of surely preventing the "aluminum slide" of the pad PD1.

From the facts described above, it is desirable to make the distance between the pad PD1 and the dummy wiring DML small, from the viewpoint of increasing the crack resistance of the surface protective film PAS, covering the end portion of the pad PD1, by making the covering shape of the surface protective film PAS gentle and making the thickness of the surface protective film PAS in the region D1 large. On the other hand, if the distance between the pad PD1 and the dummy wiring DML becomes too small, there is the possibility that the pad D1 may undergo "aluminum slide" resulting from the "aluminum slide" of the dummy wiring DML. Accordingly, there is an optimal range of the distance between the pad PD1 and the dummy wiring DML, the range which is from a certain distance while the distance is preferably made small, from the viewpoint of avoiding an appearance defect of the pad PD1 by surely preventing the "aluminum slide" of the pad PD1. The distance between the pad PD1 and the dummy wiring DML can be set, for example, by collecting data on amounts of movement by "aluminum slide".

<Method of Manufacturing Semiconductor Device>

A semiconductor device according to the present embodiment is configured as described above, and hereinafter a manufacturing method thereof will be described with reference to the drawings.

Figure 13:
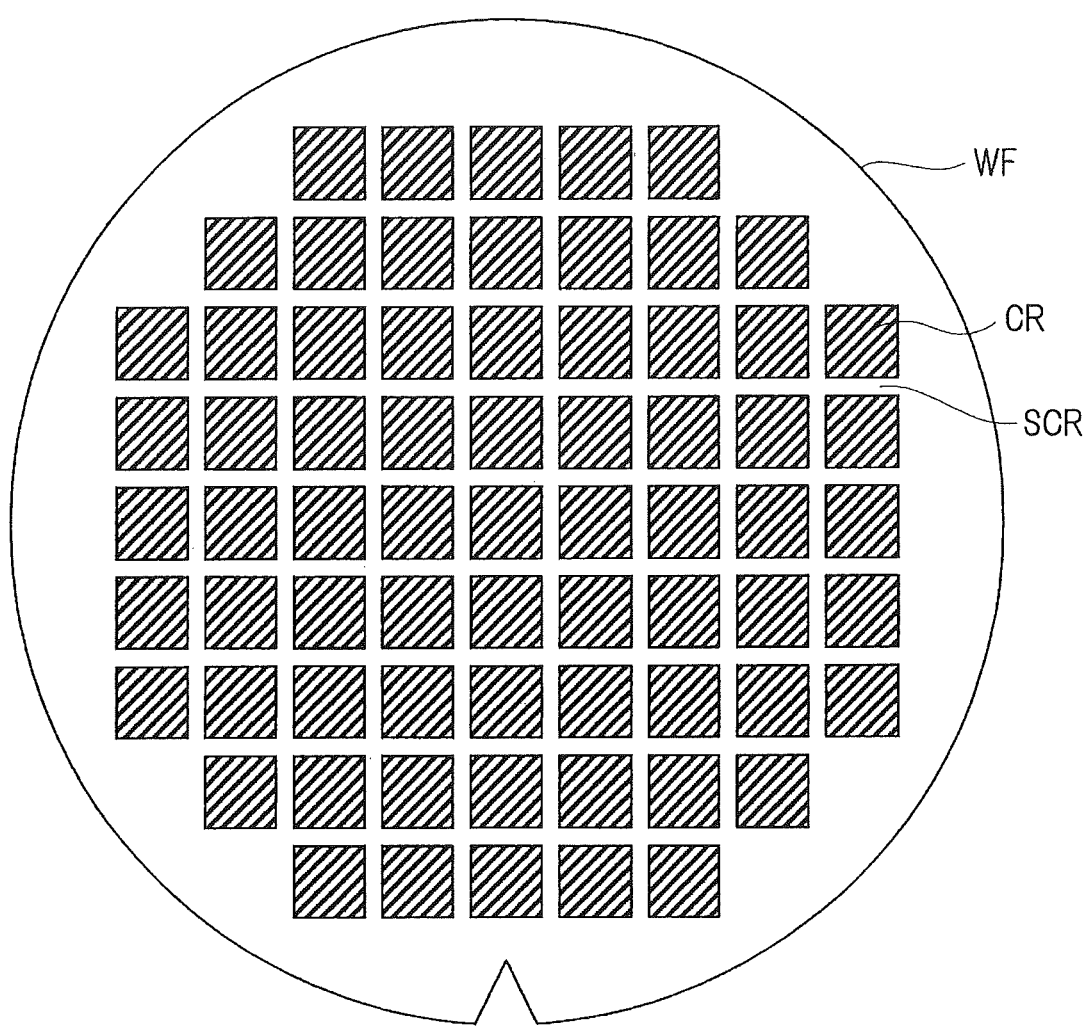
FIG. 13 is a plan view illustrating a layout configuration of a semiconductor wafer.

FIG. 13 is a plan view illustrating a layout configuration of a semiconductor wafer WF. As illustrated in FIG. 13, the semiconductor wafer WF has an approximate disk shape, and has a plurality of chip regions CR in an internal region. Both a semiconductor element represented by a field-effect transistor and a multilayer wiring layer are formed in each of the chip regions CR, and the chip regions CR are partitioned by scribe regions SCR. In the present embodiment, the semiconductor wafer (semiconductor substrate) WF, having the chip regions CR each having a rectangular shape and the scribe regions SCR partitioning the chip regions CR, is provided, as illustrated in FIG. 13. In this stage, a semiconductor element represented by a field-effect transistor is formed in each of the chip regions CR in the semiconductor wafer WF, and the multilayer wiring layer including copper wiring is formed over the semiconductor element by, for example, a damascene process. Subsequent steps will be sequentially described, after a step of forming a pad in the uppermost layer of the multilayer wiring layer in each of the chip regions CR is first described. This step will be described with attention focused on the integrated circuit region ICR in FIG. 11 corresponding to the sectional view, taken along B-B line in FIG. 9.

Figure 14:
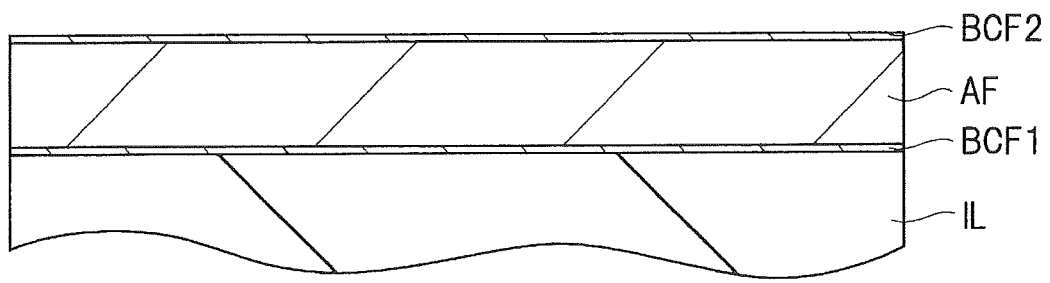
FIG. 14 is a sectional view illustrating a step of manufacturing a semiconductor device according to an embodiment.

As illustrated in FIG. 14, a laminated film, including a barrier conductor film BCF1, an aluminum film AF formed over the barrier conductor film BCF1, and a barrier conductor film BCF2 formed over the aluminum film AF, is first formed over an interlayer insulating film IL. The barrier conductor film BCF1 is formed of a laminated film including, for example, a titanium film and a titanium nitride film, and can be formed by using, for example, a sputtering process. The aluminum film AF is formed of a film including aluminum as a major component, and can be formed by using, for example, a sputtering process. Further, the barrier conductor film BCF2 is formed, for example, of a titanium nitride film, and can be formed by using, for example, a sputtering process.

Figure 15:
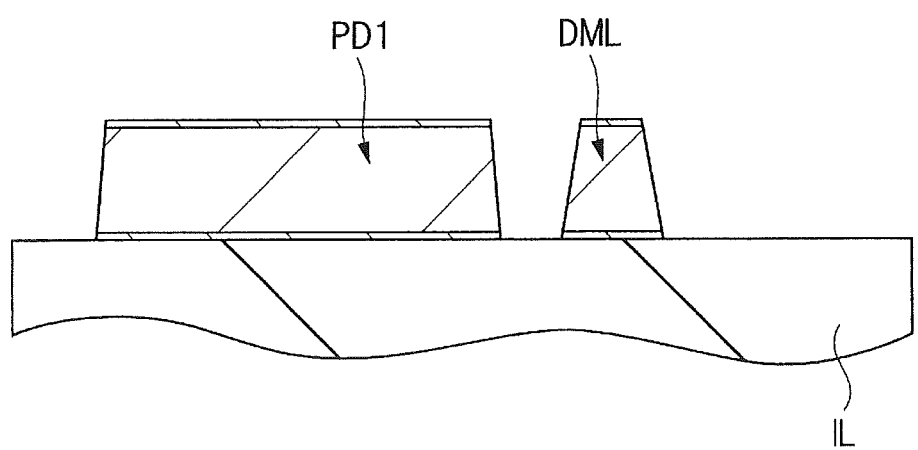
FIG. 15 is a sectional view illustrating a step of manufacturing the semiconductor device following FIG. 14.

Subsequently, patterning is performed on the laminated film, including the barrier conductor film BCF1, the aluminum film AF, and the barrier conductor film BCF2, by using a photolithography technique and an etching technology, as illustrated in FIG. 15. The pad PD1 and the dummy wiring DML can be formed by the patterning of the laminated film. At the time, the pad PD1 and the dummy wiring DML are formed to be spaced apart from each other by a certain distance and formed such that the levels of the surfaces of the two are the same as each other.

In this step, the pads PD each having a rectangular shape are formed in the chip region CR and along a boundary line between the chip region CR and the scribe region SCR (see FIG. 8), and the dummy wiring DML is formed around, of the pads PD, the pad PD1 nearest to the corner CNR of the chip region CR (see FIG. 9). As known by referring, for example, to FIG. 9, the dummy wiring DML formed in this step is formed to include: the dummy part DMP1 that is spaced apart from and to be parallel to, of the sides that form the pad PD1, the side SD1 nearest to the corner CNR of the chip region CR; and the dummy part DMP 2 that is spaced apart from and to be parallel to, of the sides that form the pad PD1, the side SD2 nearest to the boundary line (corresponding to the edge side ES in FIG. 9).

Figure 16:
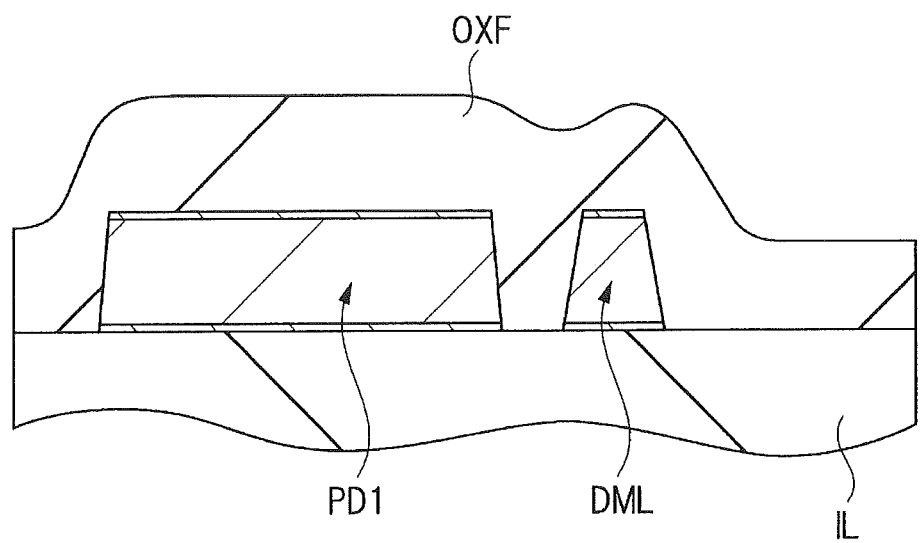
FIG. 16 is a sectional view illustrating a step of manufacturing the semiconductor device following FIG. 15.
Figure 17:
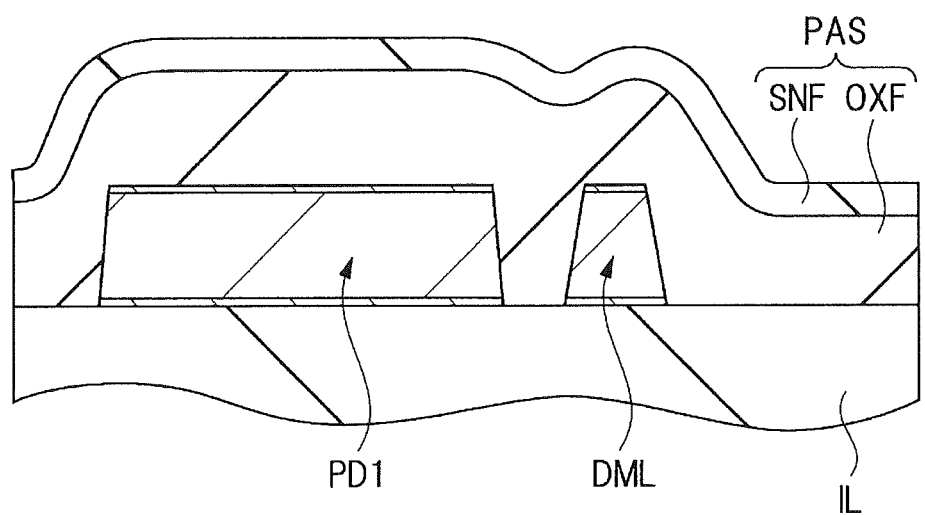
FIG. 17 is a sectional view illustrating a step of manufacturing the semiconductor device following FIG. 16.

Subsequently, a silicon oxide film OXF covering the pad PD1 and the dummy wiring DML is formed over the interlayer insulating film IL, as illustrated in FIG. 16. This silicon oxide film OXF can be formed, for example, by a high-density plasma CVD process. Subsequently, a silicon nitride film SNF is formed over the silicon oxide film OXF, as illustrated in FIG. 17. The silicon nitride film SNF can be formed by using, for example, a CVD (Chemical Vapor Deposition) process. The surface protective film PAS, including the silicon oxide film OXF and the silicon nitride film SNF, can be thus formed to cover the pad PD1 and the dummy wiring DML.

In this case, the dummy wiring DML is formed in a near-field region of the pad PD1 in the present embodiment, and hence, even if a level difference resulting from the thickness of the pad PD1 is generated, the precipitousness of the covering shape of the surface protective film PAS, covering the end portion of the pad PD1, is made gentle and the thickness of the surface protective film PAS in the end portion of the pad PD1 can be made large.

Figure 18:
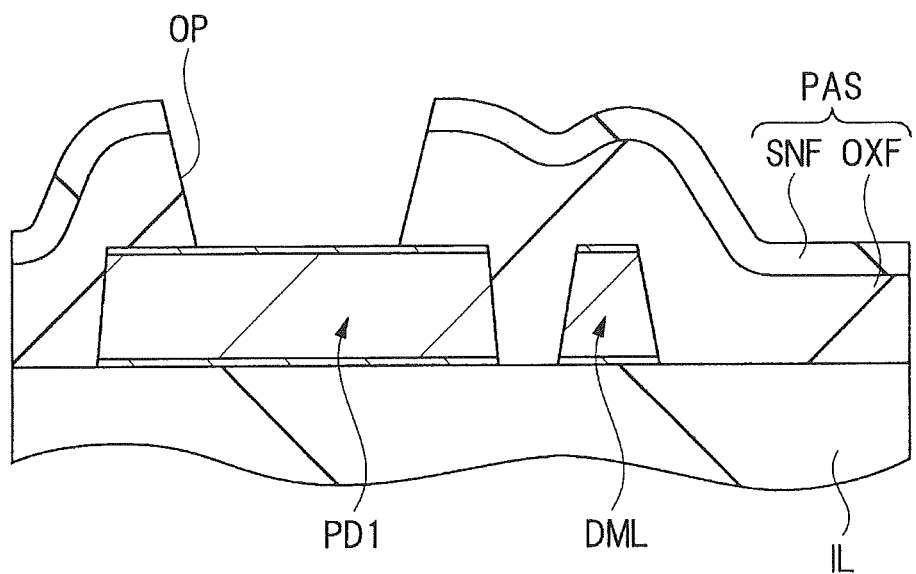
FIG. 18 is a sectional view illustrating a step of manufacturing the semiconductor device following FIG. 17.
Figure 19:
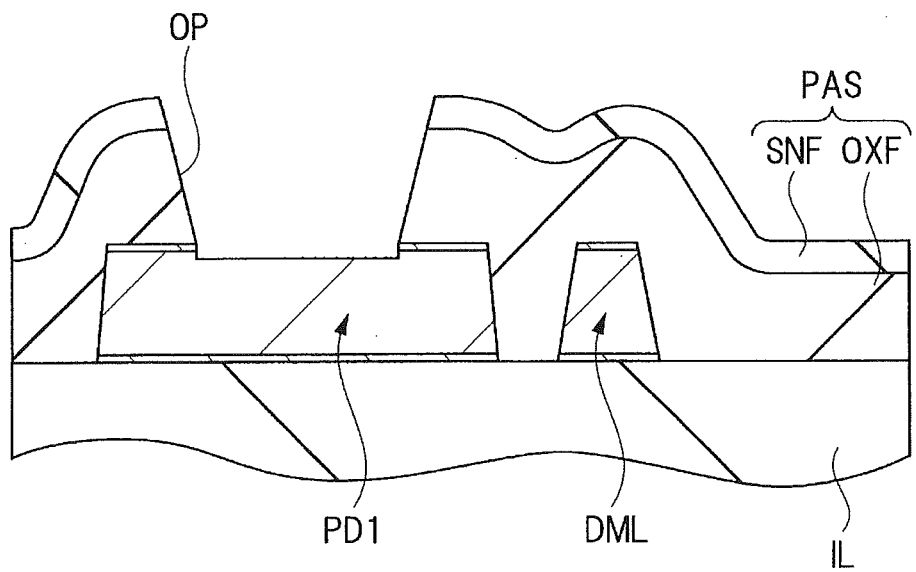
FIG. 19 is a sectional view illustrating a step of manufacturing the semiconductor device following FIG. 18.

Subsequently, the opening OP for exposing part of the surface of the pad PD1 is formed in the surface protective film PAS by using a photolithography technique and an etching technology, as illustrated in FIG. 18. On the other hand, an opening for exposing the dummy wiring DML is not formed, and the surface of the dummy wiring DML is maintained in a state of being covered with the surface protective film PAS. Subsequently, the barrier conductor film (titanium nitride film) formed over the surface of the pad PD1 exposed from the opening OP is removed by etching the surface of the exposed pad PD1, as illustrated in FIG. 19. Thereby, the aluminum film is exposed from the opening OP.

Figure 20:
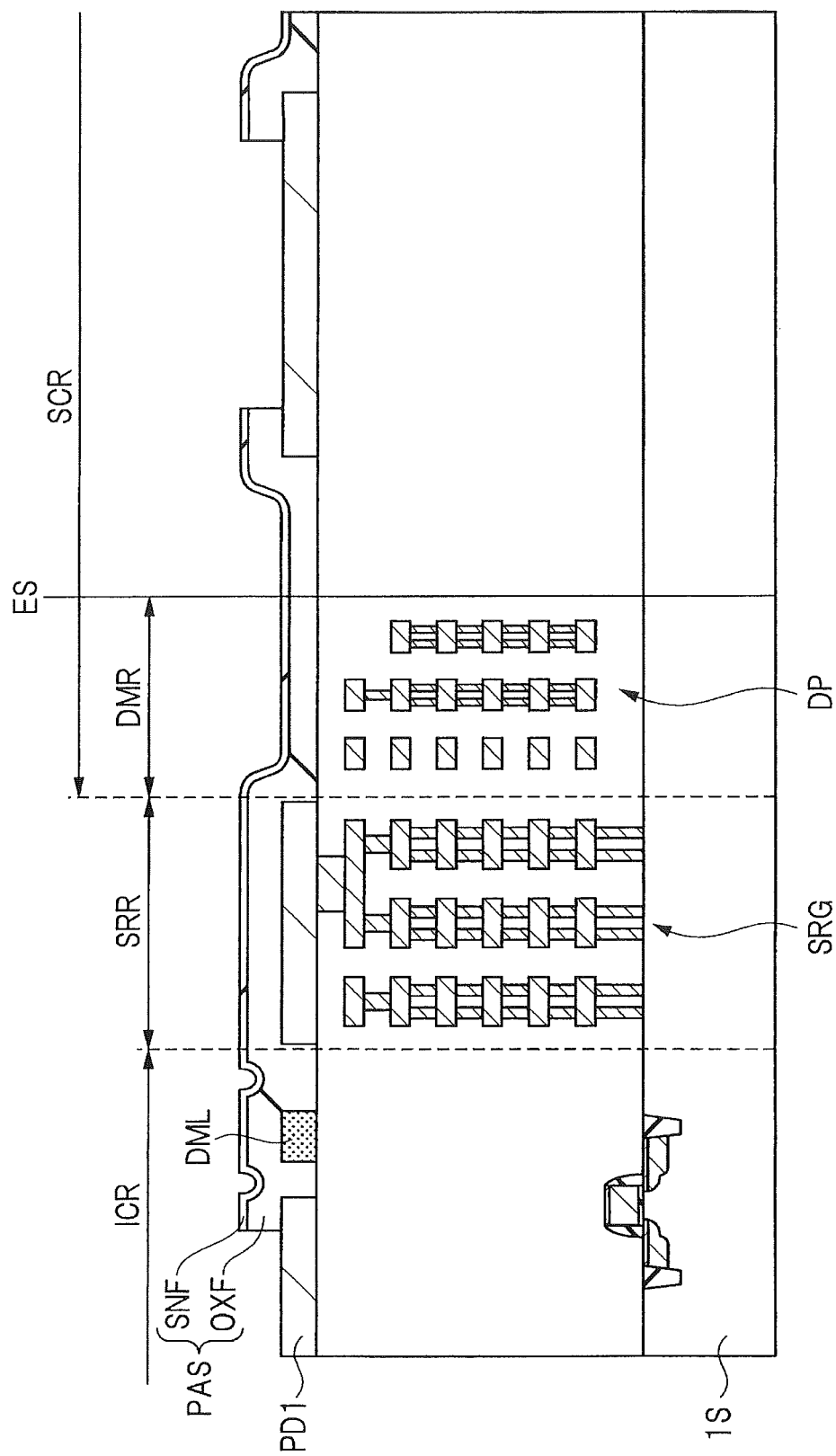
FIG. 20 is a schematic sectional view illustrating a periphery of a boundary region between a chip region and a scribe region after a pad is formed.

Thus, the pad PD1 can be formed in the uppermost layer of the multilayer wiring layer. FIG. 20 is a view illustrating a state after the pad PD1 is formed, and specifically is a schematic sectional view illustrating a periphery of a boundary region of the edge side ES. In FIG. 20, the seal ring region SRR and the integrated circuit region ICR are formed inside the scribe region SCR.

Herein, the dummy region DMR is a region integrated with the scribe region SCR. When the semiconductor wafer is cut into the respective semiconductor chips in the later-performed dicing step, part of the scribe region SCR remains inside the edge side ES of the semiconductor chip. In the present embodiment, the remaining region is described as the dummy region DMR. That is, the region near to the chip edge side ES from the seal ring region SRR is referred to as the scribe region SCR (dummy region DMR), while the region away from the seal ring region SRR is referred to as the integrated circuit region ICR, in the present embodiment.

The dummy pattern DP is formed in the dummy region DMR, and the seal ring SRG is formed in the seal ring region SRR. The dummy pattern DP and the seal ring SRG are formed in the same step as that of forming the multilayer wiring (not illustrated in FIG. 20) in the integrated circuit region ICR. It is known that, in the integrated circuit region ICR, the pad PD1 and the dummy wiring DML are formed in the uppermost layer.

Figure 21:
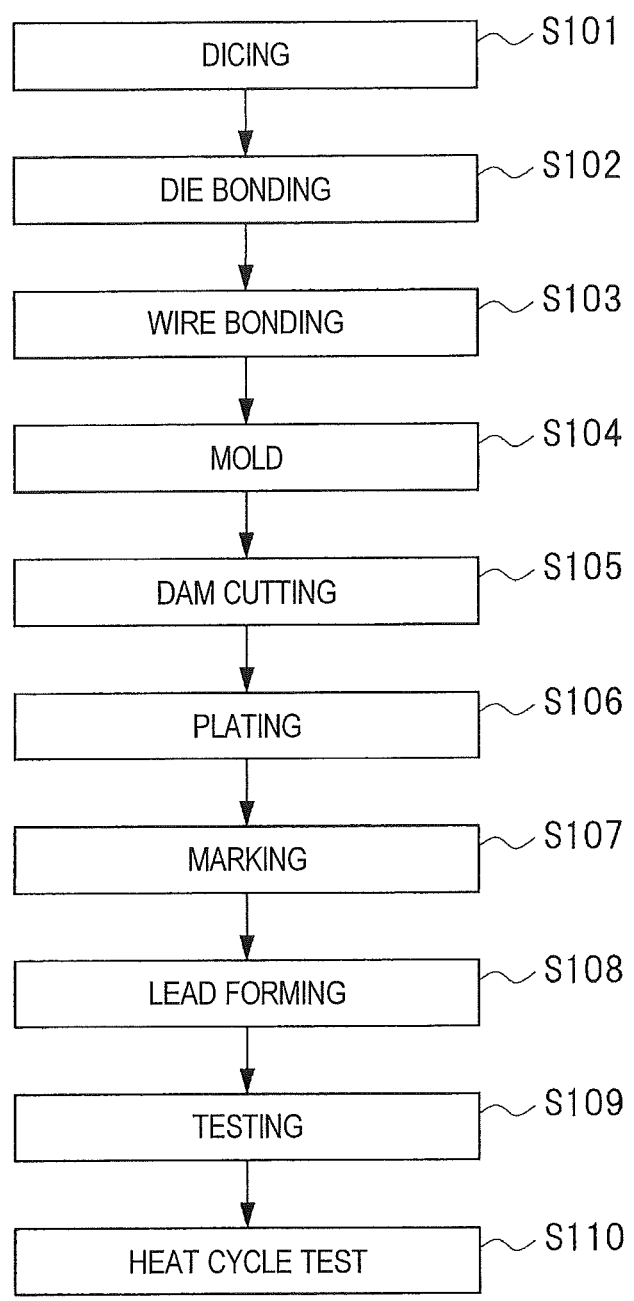
FIG. 21 is a flow chart showing the flow of steps of manufacturing a semiconductor device including a OFP package after an integrated circuit is formed in a semiconductor wafer.

Subsequently, the following steps will be described with reference to a flowchart. FIG. 21 is a flow chart showing the flow of steps of manufacturing a semiconductor device including, for example, a OFP package, after the integrated circuit is formed in the semiconductor wafer.

After an integrated circuit is first formed in each of the chip regions over the semiconductor wafer, the semiconductor wafer is diced along the scribe region (FIG. 21/S101). Thereby, the chip regions are cut into pieces and a semiconductor chip, in which an integrated circuit is formed, can be acquired. After the semiconductor chip is mounted over the chip mounting part formed in the lead frame (FIG. 21/S102), the pad formed in the semiconductor chip and the inner lead are coupled together by a wire (FIG. 21/S103). Then, the chip mounting part, the semiconductor chip, the wire, and the inner lead are sealed with a resin (FIG. 21/S104). After a dam formed in the lead frame is cut (FIG. 21/S105), a metal-plated film is formed over the surface of the outer lead exposed from the resin (FIG. 21/S106). Subsequently, a mark is formed over the surface of the resin (FIG. 21/S107), and the outer lead exposed from the resin is shaped (FIG. 21/S108). After a semiconductor device is thus manufactured, an electrical property inspection is performed (FIG. 21/S109). A heat cycle test is then performed on the semiconductor device (FIG. 21/S110), and a product determined to be a good product is shipped as a product.

Herein, in the present embodiment, by providing the dummy wiring DML in a near-field region of the end portion of the pad PD1, as illustrated, for example, in FIG. 12, the precipitousness of the curving shape of the surface protective film PAS, covering the end portion of the pad PD1, can be made gentle and the thickness of the surface protective film PAS can be made large in the region D1 of the surface protective film PAS, even if a level difference resulting from the thickness of the pad PD1 is present in the region D1. Accordingly, stress resistance can be improved in the region D1 to which the stress from the resin MR, which seals the surface protective film PAS, is likely to be applied, according to present embodiment. As a result thereof, occurrence of a crack in the surface protective film PAS can be suppressed in the region D1, according to the present embodiment, and thereby "aluminum slide", which is likely to occur when a heat cycle test is performed in a state where a crack occurs in the surface protective film PAS, can be effectively suppressed. The fact that the "aluminum slide" can be suppressed means that an appearance defect of the pad PD1 can be reduced, and thereby the reliability of a semiconductor device can be improved according to the present embodiment.

Effects in Embodiment

Typical effects acquired by the technical ideas of the present embodiment will be summarized as follows:

(1) In the pad nearest to the corner of a semiconductor chip, the precipitousness of the surface protective film, covering the end portion of the pad, is made gentle and the thickness of the surface protective film, covering the end portion of the pad, becomes large, and as a result thereof, the stress from a resin (sealing body) can be suppressed. Thereby, occurrence of a crack in the surface protective film, covering the end portion of the pad nearest to a corner of the semiconductor chip, can be suppressed according to the present embodiment.

(2) Because occurrence of a crack in the surface protective film, covering the end portion of the pad nearest to a corner of the semiconductor chip, can be suppressed according to the present embodiment, "aluminum slide", which is likely to occur when a heat cycle test is performed in a state where a crack occurs in the surface protective film, can be effectively suppressed.

(3) Because "aluminum slide" can be suppressed according to the present embodiment, an appearance defect of the pad can be reduced, and thereby the reliability of a semiconductor device can be improved.

(4) In the present embodiment, occurrence of a crack in the surface protective film, covering the end portion of a pad, can be effectively prevented, even if the generations of miniaturization of semiconductor elements and wiring are developed and a level difference resulting from the thickness of a pad becomes large. Accordingly, when a generation of miniaturization is developed and a level difference resulting from the thickness of the pad particularly becomes large, namely, when occurrence of a crack is likely to become obvious, the availability of the technical ideas of the present embodiment is increased.

(5) Further, by making the levels of the surfaces of a pad and dummy wiring the same as each other and by making the distance between the pad and the dummy wiring within a certain range, the covering shape of the surface protective film, covering the end portion of the pad, becomes gentle and the thickness of the surface protective film, covering the end portion of the pad, becomes large, and thereby crack resistance can be further improved in the present embodiment.

<First Variation>

Figure 22:
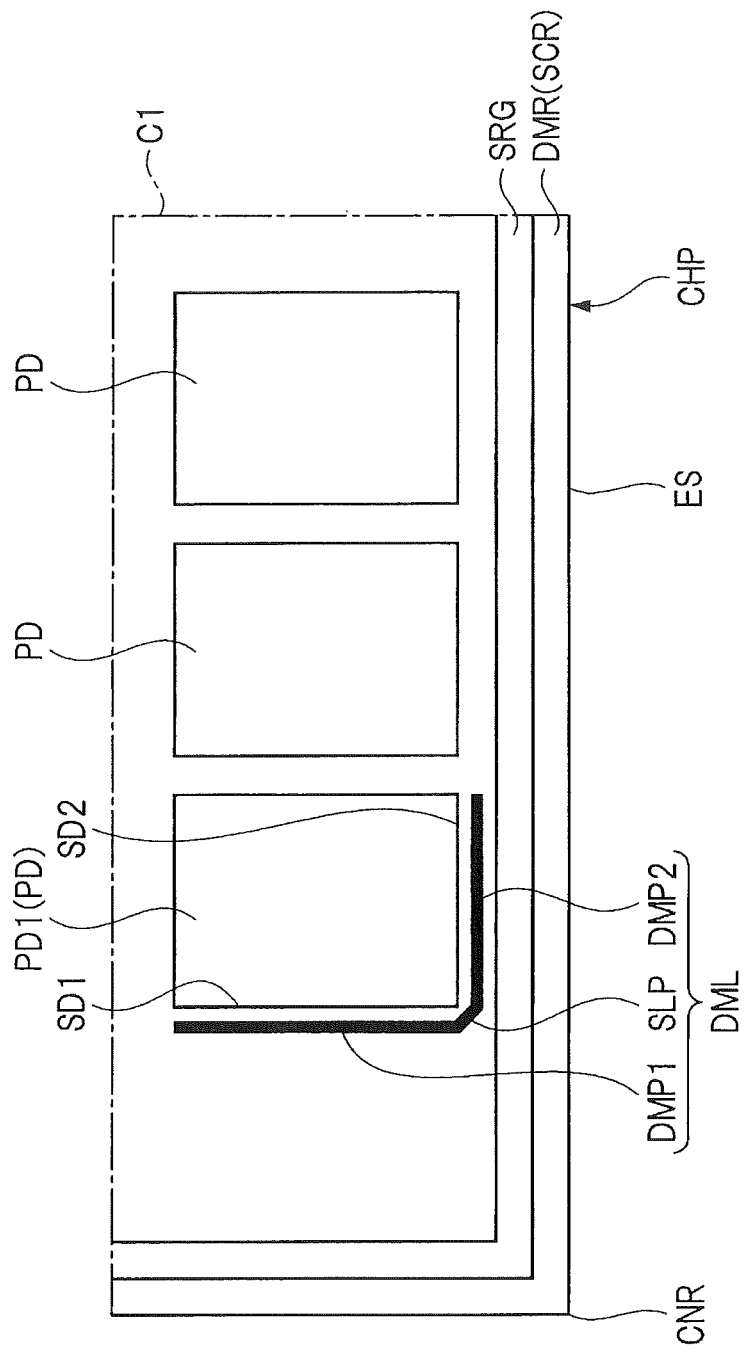
FIG. 22 is a schematic view illustrating First Variation of the embodiment, the view corresponding to an enlarged view in which the partial region of FIG. 8 is enlarged.

FIG. 22 is a schematic view illustrating First Variation of the embodiment, the view corresponding to an enlarged view in which the region C1 in FIG. 8 is enlarged. With reference to FIG. 22, the present First Variation is characterized by the fact that: dummy wiring DML is formed by a dummy part DMP1 that is spaced apart from and to be parallel to the side SD1, a dummy part DMP2 that is spaced apart from and to be parallel to the side SD2, and a slant part SLP that couples the dummy part DMP1 and the dummy part DMP2 together. In the present First Variation, the stress, to be applied to a corner of the pad PD1 nearest to the corner CNR of the semiconductor chip CHP, can be reduced by providing the slant part SLP illustrated in FIG. 22, and hence the reliability of a semiconductor device can be further improved.

<Second Variation>

Figure 23:
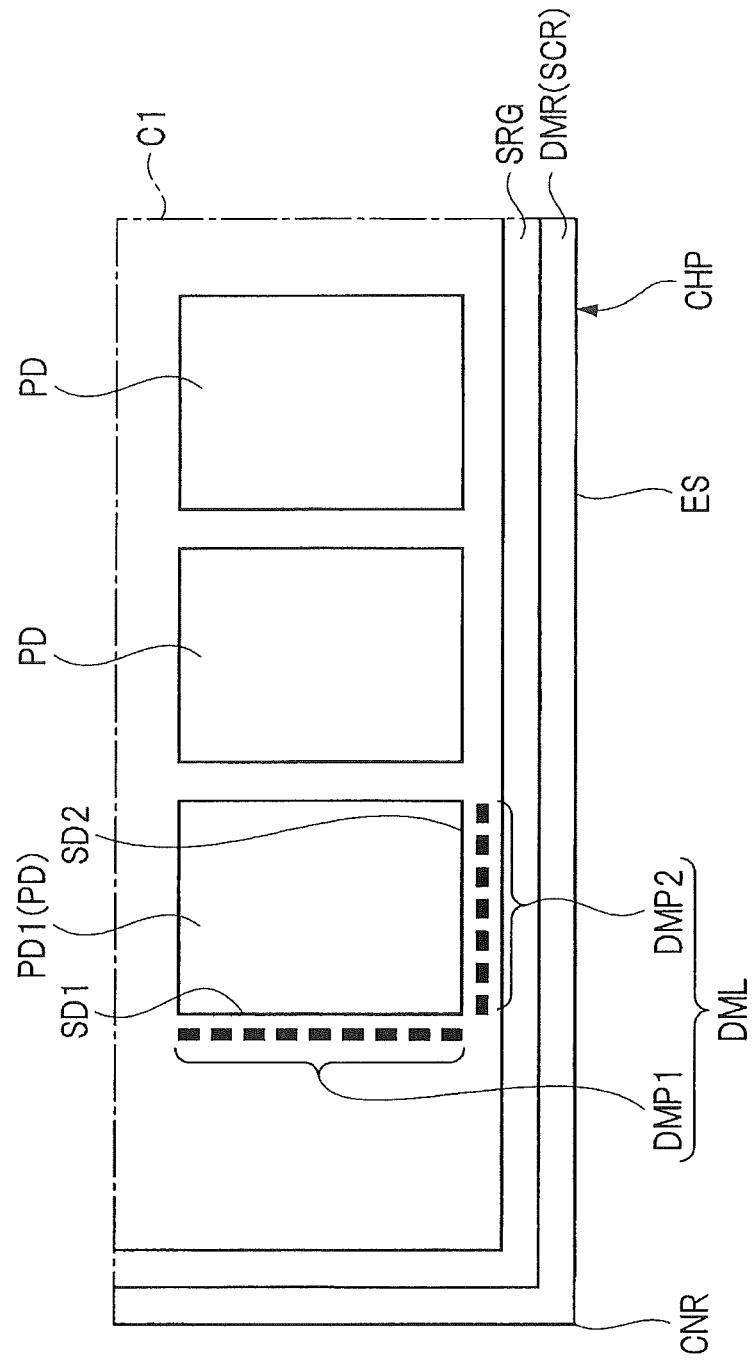
FIG. 23 is a schematic view illustrating Second Variation of the embodiment, the view corresponding to an enlarged view in which the partial region of FIG. 8 is enlarged.

FIG. 23 is a schematic view illustrating Second Variation of the embodiment, the view corresponding to an enlarged view in which the region C1 in FIG. 8 is enlarged. With reference to FIG. 23, the present Second Variation is the same as the embodiment in that the dummy wiring DML is formed by the dummy part DMP1 and the dummy part DMP2; however, in the present Second Variation, the dummy part DMP1 and the dummy part DMP2 are formed by a plurality of dot patterns, respectively. Also in this case, the precipitousness of the covering shape of a surface protective film, covering the end portion of the pad nearest to a corner of a semiconductor chip, is made gentle and the thickness of the surface protective film, covering the end portion of the pad, becomes large, in the pad similarly to the embodiment. As a result, the stress from a resin is suppressed, and hence occurrence of a crack in the surface protective film, covering the end portion of the pad nearest to a corner of a semiconductor chip, can be suppressed also in the present Second Variation. Thereby, the reliability of a semiconductor device can be improved also in the present Second Variation.

<Third Variation>

Figure 24:
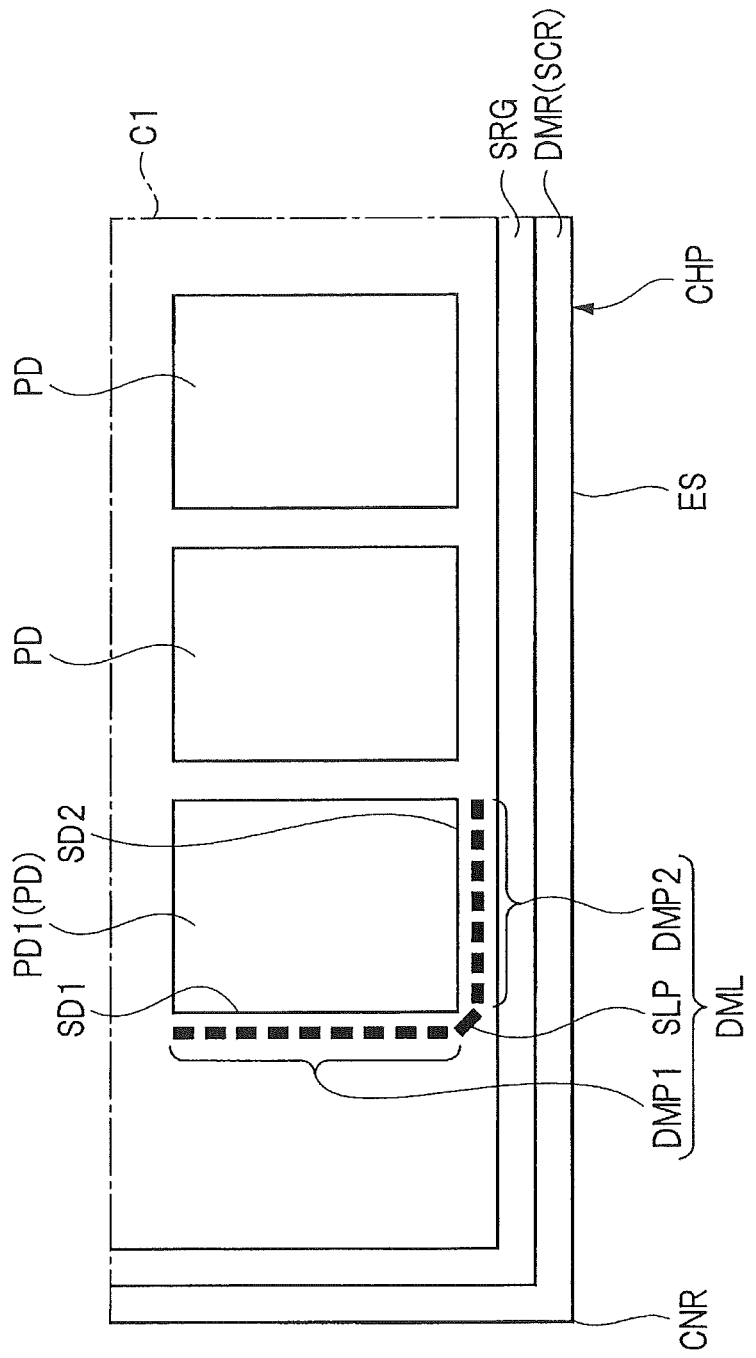
FIG. 24 is a schematic view illustrating Third Variation of the embodiment, the view corresponding to an enlarged view in which the partial region of FIG. 8 is enlarged.

FIG. 24 is a schematic view illustrating Third Variation of the embodiment, the view corresponding to an enlarged view in which the region C1 in FIG. 8 is enlarged. With reference to FIG. 24, the present Third Variation has a configuration in which the aforementioned First Variation and Second Variation are combined together. Specifically, the dummy wiring DML is formed by the dummy part DMP1, the dummy part DMP2, and the slant part SLP, and the dummy part DMP1 and the dummy part DMP2 are formed by a plurality of dot patterns, respectively. Also in this case, the precipitousness of the covering shape of a surface protective film, covering the end portion of a pad nearest to a corner of a semiconductor chip, is made gentle and the thickness of the surface protective film, covering the end portion of the pad, becomes large, in the pad similarly to the embodiment. As a result, the stress from a resin is reduced, and hence occurrence of a crack in the surface protective film, covering the end portion of the pad nearest to a corner of a semiconductor chip, can be suppressed also in the present Third Variation. Thereby, the reliability of a semiconductor device can be improved also in the present Third Variation.

<Fourth Variation>

Figure 25:
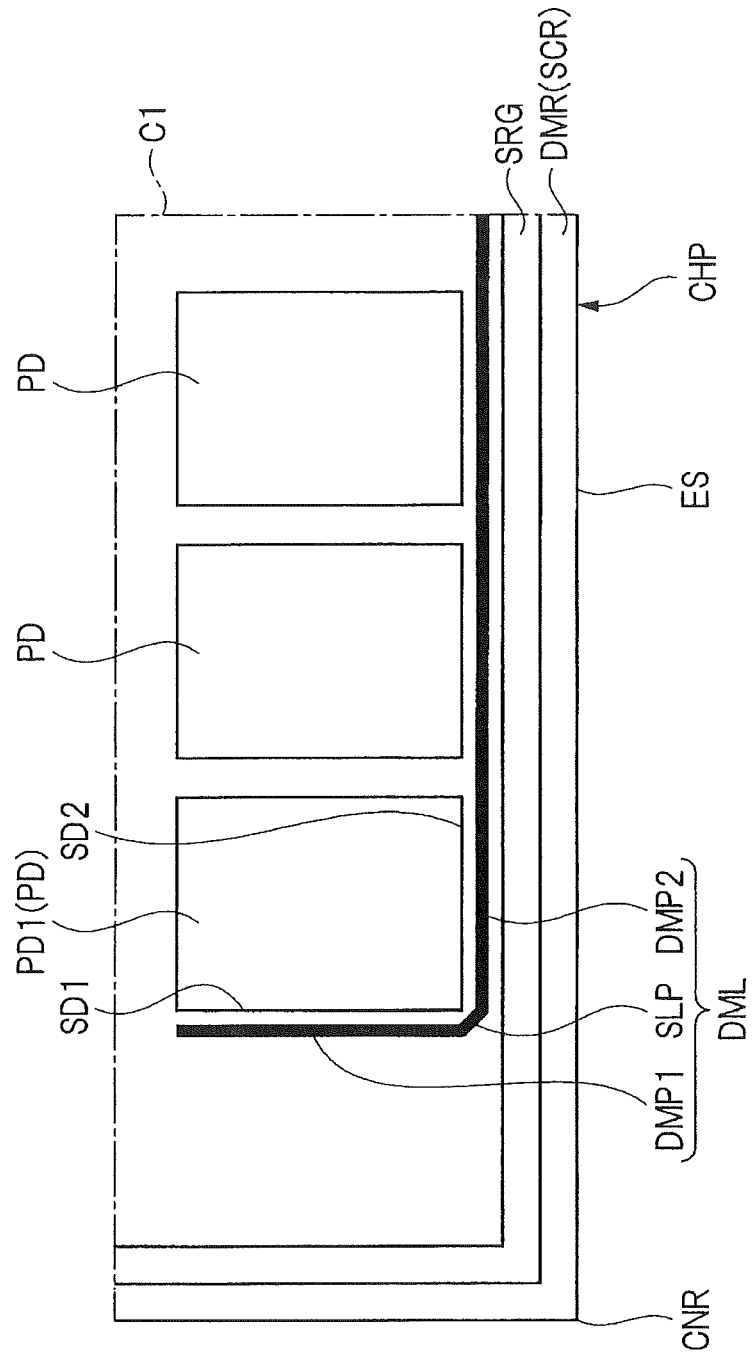
FIG. 25 is a schematic view illustrating Fourth Variation of the embodiment, the view corresponding to an enlarged view in which the partial region of FIG. 8 is enlarged.

FIG. 25 is a schematic view illustrating Fourth Variation of the embodiment, the view corresponding to an enlarged view in which the region C1 in FIG. 8 is enlarged. With reference to FIG. 25, the present Fourth Variation is the same as First Variation in that the dummy wiring DML is basically formed by the dummy part DMP1, the dummy part DMP2, and the slant part SLP. On the other hand, the present Fourth Variation is characterized by the fact that: as illustrated in FIG. 25, the dummy part DMP2, located between a plurality of the pads PD and the edge side ES of the semiconductor chip CHP, extends along the edge side ES of the semiconductor chip CHP. Thereby, occurrence of a crack in a surface protective film, covering the end portions of the pads, can be suppressed not only in the pad PD1 nearest to the corner of the semiconductor chip CHP, but also in the other pads, according to the present Fourth Variation. Thereby, the crack resistance of a surface protective film, covering the end portions of the pads, can be enhanced across the whole pads PD formed in the semiconductor chip CHP, according to the present Fourth Variation, and hence the reliability of a semiconductor device can be further improved.

<Fifth Variation>

Figure 26:
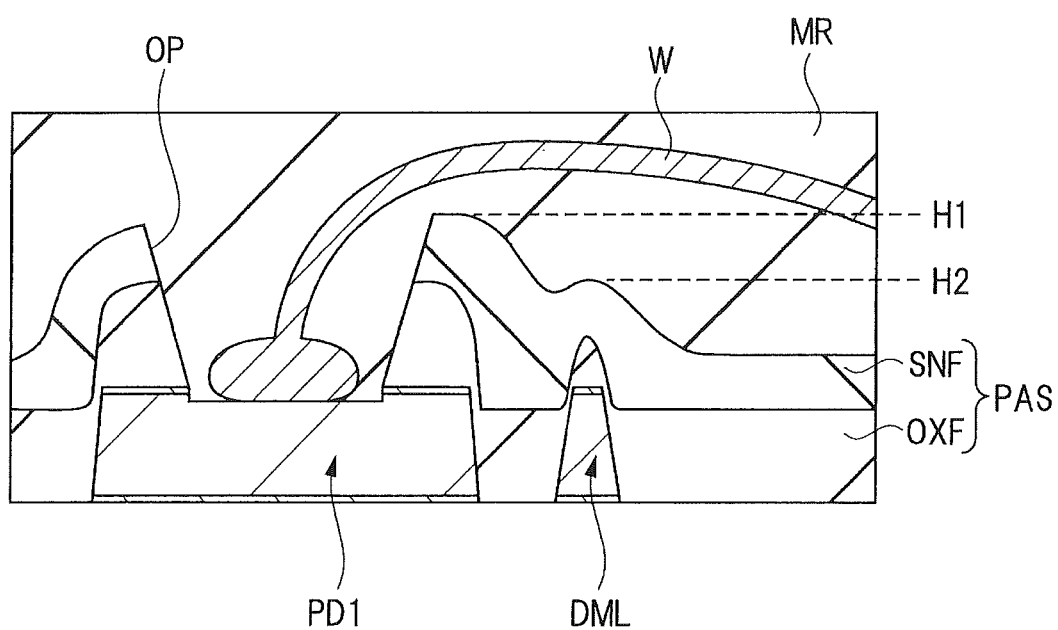
FIG. 26 is a schematic view illustrating Fifth Variation of the embodiment.

FIG. 26 is a schematic view illustrating Fifth Variation of the embodiment. As known from the comparison of FIG. 12 with FIG. 26, the width of the dummy wiring DML in the present Fifth Variation illustrated in FIG. 26 is smaller than that of the dummy wiring DML in the embodiment illustrated in FIG. 12. Specifically, the width (width of the upper base) of the dummy wiring DML in the present Fifth Variation illustrated in FIG. 26 is, for example, approximately 1 µm, while that of the dummy wiring DML in the embodiment illustrated in FIG. 12 is, for example, approximately 2 µm. In this case, a configuration is achieved in the present Fifth Variation, in which the level H2 of the surface protective film PAS, covering the dummy wiring DML, is lower than the level H1 of the surface protective film PAS, covering the pad PD1, while the levels of the surfaces of the pad PD1 and the dummy wiring DML are the same as each other. It is because the silicon oxide film OXF, which forms part of the surface protective film PAS, is formed by a high-density plasma CVD process. That is, because the high-density plasma CVD process is characterized by depositing a film while etching the film, an etching effect becomes remarkable over the dummy wiring DML having a small width, while the silicon oxide film OXF having a large thickness is deposited over the pad PD1 having a large width, as illustrated in FIG. 26; and the thickness of the silicon oxide film OXF formed over the dummy wiring DML becomes smaller than that of the silicon oxide film OXF formed over the pad PD1.

As a result, the precipitousness of the covering shape of the surface protective film PAS, covering the end portion of the pad PD1, is made gentle and the thickness of the surface protective film PAS, covering the end portion of the pad PD1, becomes large, also in the present Fifth Variation, as illustrated in FIG. 26. As a result, the stress from a resin MR is suppressed, and thereby occurrence of a crack in the surface protective film PAS, covering the end portion of the pad PD1 nearest to a corner of a semiconductor chip, can be suppressed also in the present Fifth Variation. Thereby, the reliability of a semiconductor device can be improved also in the present Fifth Variation.

The present Fifth Variation further has a peculiar advantage that: not only the precipitousness of the covering shape is made gentle and the thickness of the surface protective film PAS becomes large in the surface protective film PAS covering the end portion of the pad PD1, but also the precipitousness of the covering shape of the surface protective film PAS, covering the end portion of the dummy wiring DML, is made gentle and the thickness thereof becomes large.

Hereinafter, the reason will be described. For example, in the embodiment illustrated in FIG. 12, the thickness of the surface protective film PAS formed over the pad PD1 and that of the surface protective film PAS formed over the dummy wiring DML are almost the same as each other. Thereby, the precipitousness of the covering shape can be made gentle and the thickness of the surface protective film PAS can be made large in the surface protective film PAS covering the end portion of the pad PD1, as illustrated in FIG. 12; however, in the end portion of the dummy wiring DML, the covering shape has a shape in which a level difference, resulting from the thickness of the dummy wiring DML, is sensitively reflected. That is, the covering shape of the surface protective film PAS in the end portion of the dummy wiring DML becomes precipitous and the thickness thereof becomes small, as illustrated in FIG. 12. However, if a crack occurs in the surface protective film PAS covering the end portion of the dummy wiring DML illustrated in FIG. 12 and thereby "aluminum slide" occurs, the "aluminum slide" occurs only in the dummy wiring DML, as described in the embodiment. That is, even if a crack occurs in the surface protective film PAS covering the end portion of the dummy wiring DML illustrated in FIG. 12, "aluminum slide" does not occur in the pad PD1 itself, which causes no problem. However, a situation in which a crack occurs in the surface protective film PAS is not desirable, although "aluminum slide" does not occur in the pad PD1 itself.

Regarding this point, the thickness of the surface protective film PAS formed over the dummy wiring DML becomes smaller than that of the surface protective film PAS formed over the pad PD1, in the present Fifth Variation illustrated, for example, in FIG. 26. From this, according to the present Fifth Variation, the precipitousness of the covering shape can be made gentle and the thickness of the surface protective film PAS can be made large in the surface protective film PAS covering the end portion of the pad PD1, and the precipitousness of the covering shape can be made gentle and the thickness of the surface protective film PAS can be made large also in the surface protective film PAS covering the end portion of the dummy wiring DML, as illustrated in FIG. 26. That is, in the present Fifth Variation, not only occurrence of a crack in the surface protective film PAS covering the end portion of the pad PD1, but also occurrence of a crack in the surface protective film PAS covering the end portion of the dummy wiring DML can be suppressed. Accordingly, it can be said that the availability of the technical ideas of the present Fifth Variation is high from the viewpoint of improving the reliability of a semiconductor device in terms that occurrence of a crack in any location of the surface protective film PAS can be suppressed.

The invention made by the present inventors has been specifically described above based on its preferred embodiments, but it is needless to say that the invention should not be limited to the embodiments and may be modified variously within a range not departing from the gist thereof.

What is claimed is:

1. A semiconductor device comprising:
   a corner constituted by a first side and a second side being perpendicular to the first side; and
   a plurality of pads including a first pad, arranged along the second side and formed over a semiconductor substrate,
   wherein the first pad is arranged nearer the corner than other pads of the plurality of pads,
   wherein the first pad includes a third side, a fourth side being perpendicular to the third side, a fifth side being parallel to the third side and a sixth side being perpendicular to a fifth side,
   wherein the third side and the fourth side are nearer to the corner than the fifth side and sixth side,
   wherein a first dummy wiring is formed along the first side,
   wherein a second dummy wiring is formed along the second side,
   wherein the first dummy wiring and the second dummy wiring are formed integrally with each other,
   wherein a semiconductor element is formed in the semiconductor substrate, and
   wherein the first dummy wiring and the second dummy wiring are not electrically coupled to the semiconductor element, so that the first dummy wiring and the second dummy wiring do not function as wiring.

2. The semiconductor device according to claim 1,
   wherein a potential of the first dummy wiring and a potential of the second dummy wiring are in a floating state.

3. The semiconductor device according to claim 1,
   wherein the first dummy wiring and the second dummy wiring are formed in a same layer as the first pad.

4. The semiconductor device according to claim 3,
   wherein a level of a surface of the first dummy wiring is a same as that of a surface of the first pad.

5. The semiconductor device according to claim 1,
   wherein a seal ring is formed over the semiconductor substrate, is arranged along the first side and the second side and is arranged between the second dummy wiring and the second side.

6. A semiconductor device comprising:
   a corner constituted by a first side and a second side being perpendicular to the first side; and
   a plurality of pads including a first pad, arranged along the second side and formed over a semiconductor substrate,
   wherein the first pad is arranged nearer the corner than other pads of the plurality of pads,
   wherein the first pad includes a third side, a fourth side being perpendicular to the third side, a fifth side being parallel to the third side and a sixth side being perpendicular to a fifth side,
   wherein the third side and the fourth side are nearer to the corner than the fifth side and sixth side,
   wherein a first dummy wiring is formed along the first side,
   wherein a second dummy wiring is formed along the second side,
   wherein the first dummy wiring and the second dummy wiring are formed integrally with each other,
   wherein a seal ring is formed over the semiconductor substrate, is arranged along the first side and the second side and is arranged between the second dummy wiring and the second side,
   wherein a semiconductor element is formed in the semiconductor substrate, and
   wherein wiring to be electrically coupled to the semiconductor element is not provided between the second dummy wiring and the seal ring.

7. The semiconductor device according to claim 1,
   wherein a surface protective film is formed to cover the pads, the first dummy wiring and the second dummy wiring, and
   wherein openings, for exposing part of a surface of each of the pads, are formed in the surface protective film.

8. The semiconductor device according to claim 1,
   wherein a length of the first dummy wiring along a direction of the third side is larger than a length of the first dummy wiring along a direction of the fourth side, and
   wherein a length of the second dummy wiring along a direction of the fourth side is larger than a length of the second dummy wiring along a direction of the third side.

9. The semiconductor device according to claim 8,
   wherein a potential of the first dummy wiring and a potential of the second dummy wiring are in a floating state.

10. A semiconductor device comprising:
    a corner constituted by a first side and a second side being perpendicular to the first side; and
    a plurality of pads including a first pad, arranged along the second side and formed over a semiconductor substrate,
    wherein the first pad is arranged nearer the corner than other pads of the plurality of pads,
    wherein the first pad includes a third side, a fourth side being perpendicular to the third side, a fifth side being parallel to the third side and a sixth side being perpendicular to a fifth side,
    wherein the third side and the fourth side are nearer to the corner than the fifth side and sixth side,
    wherein a first dummy wiring is formed along the first side,
    wherein a second dummy wiring is formed along the second side,
    wherein the first dummy wiring and the second dummy wiring are formed integrally with each other,
    wherein a length of the first dummy wiring along a direction of the third side is larger than a length of the first dummy wiring along a direction of the fourth side,
    wherein a length of the second dummy wiring along a direction of the fourth side is larger than a length of the second dummy wiring along a direction of the third side,
    wherein a potential of the first dummy wiring and a potential of the second dummy wiring are in a floating state, wherein a MISFET is formed in the semiconductor substrate, and wherein the first dummy wiring and the second dummy wiring are not electrically coupled to the MISFET.

11. The semiconductor device according to claim 9, wherein a seal ring is formed over the semiconductor substrate, is arranged along the first side and the second side and is arranged between the second dummy wiring and the second side.

* * * * *